United States Patent [19]
Kurokawa et al.

[11] Patent Number: 6,054,975
[45] Date of Patent: Apr. 25, 2000

[54] LIQUID CRYSTAL DISPLAY DEVICE HAVING TAPE CARRIER PACKAGES

[75] Inventors: Kazunari Kurokawa; Takahiro Fujioka, both of Mobara; Shinji Yasukawa, Shirako-machi; Akira Ogura, Nagara-machi; Hiroyuki Takahashi, Mobara, all of Japan

[73] Assignee: Hitachi, Ltd., Tokyo, Japan

[21] Appl. No.: 08/904,688

[22] Filed: Aug. 1, 1997

[30] Foreign Application Priority Data

Aug. 1, 1996 [JP] Japan ..................................... 8-203985
Aug. 1, 1996 [JP] Japan ..................................... 8-203986

[51] Int. Cl.[7] ........................................................ G09G 3/36
[52] U.S. Cl. ............................ 345/100; 345/206; 349/149
[58] Field of Search .............................. 345/100, 87, 205, 345/206; 349/149, 150, 151, 152; 361/767, 771, 773, 777, 779

[56] References Cited

U.S. PATENT DOCUMENTS

| | | | |
|---|---|---|---|
| 5,266,936 | 11/1993 | Saitoh ........................................ | 345/98 |
| 5,283,677 | 2/1994 | Sagawa et al. ............................. | 359/88 |
| 5,341,233 | 8/1994 | Tomoike et al. .......................... | 361/776 |
| 5,365,355 | 11/1994 | Hastings, III et al. .................... | 359/59 |
| 5,414,443 | 5/1995 | Kanatani et al. .......................... | 345/95 |
| 5,572,346 | 11/1996 | Sakamoto et al. ........................ | 361/749 |

FOREIGN PATENT DOCUMENTS 4-42547  2/1992  Japan .
8-43843  2/1996  Japan .

*Primary Examiner*—Dennis-Doon Chow
*Attorney, Agent, or Firm*—Antonelli, Terry, Stout & Kraus, LLP

[57] ABSTRACT

A liquid crystal display device whose architrave area is reduced by reducing a distance between input and output terminals of each tape carrier package for supplying driving voltages to the liquid crystal display device is provided. The liquid crystal display device to which the present invention is applied comprises a liquid crystal display panel, a plurality of tape carrier packages provided around the liquid crystal display panel and a circuit board connected to each tape carrier package. Each tape carrier package comprises a semiconductor chip having a plurality of input terminals and a plurality of output terminals and a film having an opening at the middle thereof and provided, at the opening thereof, with a plurality of input side wires to be connected to the plurality of input terminals of the semiconductor chip and a plurality of output side wires to be connected to the plurality of output terminals of the semiconductor chip. A distance between the input terminals and the output terminals is reduced by disposing a plurality of kinds of functional element blocks within the semiconductor chip so that a part is created through which an imaging data signal input from the input terminal flows in the opposite direction from the direction in which the liquid crystal display device is disposed.

10 Claims, 22 Drawing Sheets

FIG. 24
PRIOR ART
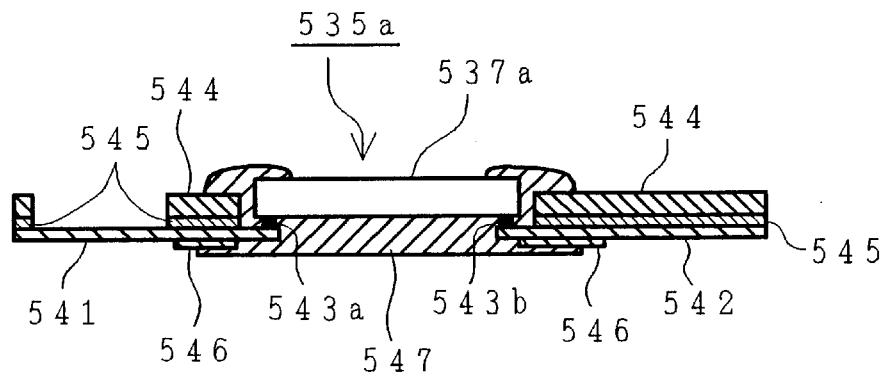
FIG. 25(a)
PRIOR ART
FIG. 25(b)
PRIOR ART
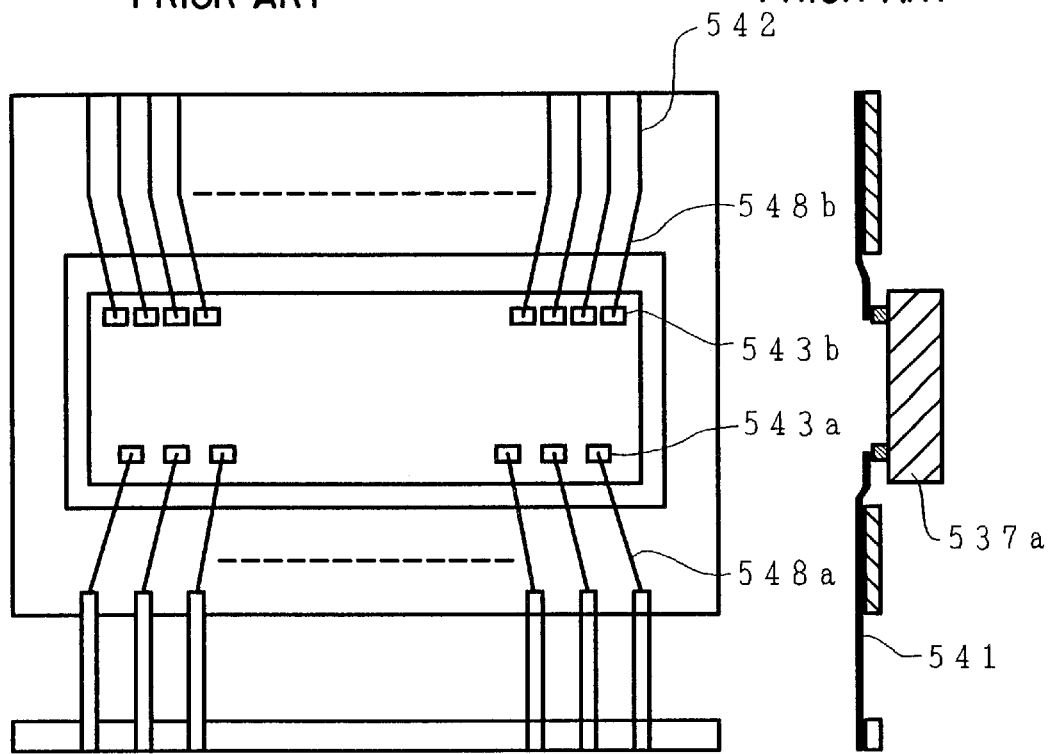

LIQUID CRYSTAL DISPLAY DEVICE HAVING TAPE CARRIER PACKAGES

BACKGROUND OF THE INVENTION

The present invention relates to a liquid crystal display device having tape carrier packages, and more particularly, to a large liquid crystal display device whose architrave portion is small.

Conventional liquid crystal display devices may be roughly categorized into a simple matrix liquid crystal display device, arranged so as to drive pixels at intersections of striped X and Y electrodes, and an active matrix liquid crystal display device having an active element, e.g. a thin film transistor, per pixel and arranged so as to switch and drive the active elements.

As shown in FIG. 23, the typical liquid crystal display device is provided with a driving circuit board 524 (which is divided into three driving circuit boards 524a, 524b and 524c in general) around a liquid crystal panel 503 to supply imaging signals to imaging pixels within the panel. Each one of the driving circuit boards 524a, 524b and 524c is provided along a respective side of the liquid crystal panel 503, and they are electrically connected to each other by a flat cable 536. Tape carrier packages 535a, 535b and 535c and electronic parts, such as a resistor and a capacitor, are mounted on each one of the driving circuit boards 524a, 524b and 524c, and IC chips (semiconductor chips) 537a, 537b and 537c for driving the liquid crystal panel 503 are mounted on each one of the tape carrier packages 535a, 535b and 535c by means of tape automated bonding (TAB).

Each of the tape carrier packages 535a and 535b forms one of the segment drivers IC-U1 through Un and IC-L1 through Ln, respectively, to be described later, and each tape carrier package 535c forms one of the common drivers IC-C1 through Cn, to be described later. In this example, the IC chips 537a and 537b mounted on the tape carrier packages 535a and 535b, respectively, are provided with a circuit shown in FIG. 20, to be described later, i.e. an input side bonding pad of the IC chip, a random logic circuit 510, a shift register circuit 511, a bit latch circuit 512, a line latch circuit 513, a selector circuit 514, an output buffer circuit 515 and an output side bonding pad, disposed in order along the direction of the flow of signals (data).

FIG. 24 is a section view of the prior art tape carrier package 535a. In the figure, the reference numeral 541 denotes an input side wire of the IC chip 537a and 542 denotes an output side wire. An input side bonding pad 543a of the IC chip 537a is connected with an inner lead of the input side wire 541 and an output side bonding pad 543b is connected with an inner lead of the output side wire 542 by so-called gang bonding. Here, the input side wire 541 and the output side wire 542 are made of copper (Cu) for example.

Outer leads of the input side wire 541 and the output side wire 542 correspond to input and output terminals of the IC chip 537a, respectively, and the outer lead of the input side wire 541 is connected with a terminal of the driving circuit board 524a by soldering or the like, while the outer lead of the output side wire 542 is connected with a terminal of the liquid crystal panel 503 by an anisotropic conductive film. A base film 544 is made of polyimide or the like and is bonded with the input side wire 541 and the output side wire 542 by adhesive 545. There are also provided a solder resist film 546 for masking so that no solder is applied unnecessarily during soldering and a thermosetting resin 547 for protecting the IC chip 537a. Such a protecting member is described in Japanese Patent Laid-Open Nos. Hei. 4-42547 and Hei. 8-43843.

FIG. 25 is a diagrammatic enlarged view of the tape carrier package 535a shown in FIG. 23. It is noted that FIG. 25 shows a state in which the thermosetting resin 547 for protecting the IC chip 537a is removed in order to facilitate an understanding thereof.

Because the pitch of the terminals (segment electrode terminals) of the liquid crystal panel 503 is different from the pitch of the output side bonding pads 543b, the output side wires 542 of the tape carrier package 535a are slanted such that the pitch thereof becomes narrow along the wires from the outer leads thereof where the pitch is wide to the inner leads where the pitch is narrow, as shown in FIG. 25. A similar slanted wiring arrangement is required more or less also for the input side wire 541 of the tape carrier package 535a. Thus, the use of slanted wires 548a and 548b has been necessary in the input side wire section 541 and the output side wire section 542 of the tape carrier package 535a in order to adjust the pitches at each lead of the input side wire 541 and the output side wire 542.

There has been a tendency to increase the size of the display screen lately with respect to the overall size of the liquid crystal display device, such as a liquid crystal display module (LCM), and, for this purpose, there is an increased demand to reduce an area outside the display area of the liquid crystal display device, i.e. the architrave portion thereof, as much as possible in order to eliminate useless space and to give the display a fine appearance. While it is desirable to reduce the area around a display window of an upper frame 521, as shown in FIG. 22, to be described later, in order to reduce the architrave portion of the liquid crystal display module (LCM), the tape carrier packages 535 and the driving circuit board 524 are located in the area around the display window of the upper frame 521. Therefore, to achieve this objective, it is necessary to miniaturize the tape carrier packages 535 and the driving circuit board 524 located in the area on and under the upper frame 521 in order to reduce the architrave portion on and under the liquid crystal display module (LCM). For this purpose, it is conceivable to (1) miniaturize the electronic parts disposed on the driving circuit board 524, to reduce a number of the electronic parts or to reorganize the layout thereof, or (2) miniaturize the tape carrier packages 535 to provide enough space for the electronic parts to be disposed on the driving circuit board 524, while permitting the display window to be enlarged as much as possible.

However, the organization in mounting the electronic parts on the driving circuit board 524 in the above-mentioned proposal (1) seems to have reached its limit, so that the tape carrier package 535 has to be miniaturized as described above in the proposal (2). Especially, the length (TCP width) of the tape carrier packages 535a and 535b in the direction of wiring, i.e. the input side wire 541 and the output side wire 542, must to be reduced. However, it has been difficult to reduce the length of the conventional tape carrier packages 535a and 535b in the wiring direction for the following reasons:

(1) Because the terminal of the driving circuit board 524 and the terminal of the liquid crystal panel 503 are connected to the outer leads of the input side wire 541 and the output side wire 542 of the tape carrier packages 535a and 535b, the outer leads of the input side wire 541 and the output side wire 542 of the tape carrier packages 535a and 535b must have a certain minimum length that fully assures the reliability of the connection.

Further, the slanted wires 548a and 548b of a predetermined length are necessary in order to adjust the pitch at each lead of the input side wire 541 and the output side wire 542 with respect to the input side wire 541 and the output side wire 542 of the tape carrier packages 535a and 535b.

Under such a presupposition, when the size of the display screen of the liquid crystal display device is increased and the pitch size of the outer leads of the output side wire 542 of the tape carrier packages 535a and 535b is increased (or the size of the IC chips 537a and 537b is reduced and the pitch size of the inner leads of the output side wires 542 of the tape carrier packages 535a and 535b is reduced), the wire extending length (LO) of the slanted wire 548b of the output side wire 542 of the tape carrier packages 535a and 535b increases. Especially, because the pitch (e.g. 90 to 95 $\mu$m) and the number (e.g. 240) of the electrodes which extend from the inside of the liquid crystal display device is set without direct connection with the mounting on the tape carrier package, the slanted wiring section of the output side wire is essential in the connection with the pitch (e.g. 80 to 85 $\mu$m) of the output terminals of the semiconductor chip.

It is noted, that although the same applies to the pitch of the input terminals of the semiconductor chip, similarly to the output terminals, a number of dummy input terminals which do not contribute to the display are generally provided. While the input terminals including such dummy terminals are connected with the same number of input side wires at an opening of the package, they connect to the input side wire or another dummy terminals on the middle of the film and a fewer number of input side wires (e.g. 30) are connected with the terminals of the driving circuit board and contribute to the signal input, so that the slanted wiring section of input side wires is not always necessary.

(2) Dummy input side bonding pads are provided on the semiconductor chips 537a and 537b and these dummy input side bonding pads are connected to an NC pin (a dead pin or dummy pin) in the input side wiring section of the tape carrier packages 535a and 535b in the prior art tape carrier package.s 535a and 535b in order to assure the uniformity of the inner leads of the input side wire 541 and the output side wire 542 during the bonding thereof.

In this case, although a protecting diode is provided on the normal input side bonding pad 543a, no protecting diode is provided on the dummy input side bonding pad to which the NC pin is connected. Therefore, there has been a problem that static electricity flows through and destroys the semiconductor chips 537a and 537b when static electricity is applied to the NC pin or the dummy input side bonding pad.

(3) While a thermosetting resin for protecting the IC chip is provided around the IC chip, there is a case wherein the resin leaks even to an area connecting the liquid crystal display device and the circuit board on the face of the base film opposite from the face on which the wires are formed, causing a defective connection.

Accordingly, it is an object of the present invention to provide a technology which allows the architrave area, other than the display area, to be reduced further in a liquid crystal display device.

It is another object of the present invention to provide a technology which allows the distance between input and output terminals to be reduced and to prevent the semiconductor chip from being destroyed by static electricity applied from the dummy input side wire or from the dummy input terminal of the semiconductor chip in a liquid crystal driving device.

It is a further object of the present invention to provide a technology which allows the distance between the input and output terminals reduced and to prevent the protecting film to be formed around the semiconductor chip from leaking to the areas of the input and output terminals in a liquid crystal driving device.

SUMMARY OF THE INVENTION

The typical features of the present invention as disclosed in the present specification will be briefly explained as follows:

(1) A liquid crystal display device comprises a liquid crystal display panel; a plurality of tape carrier packages provided around the liquid crystal display panel and having liquid crystal driving circuits for outputting driving voltages to electrodes of the liquid crystal display panel; and circuit boards for supplying signals to the liquid crystal driving circuits, wherein each tape carrier package comprises a semiconductor chip having a plurality of input terminals and a plurality of output terminals and a film having an opening at the middle thereof and provided with a plurality of output side wires to be connected to a plurality of electrodes of the liquid crystal display panel and a plurality of input side wires to be connected to the circuit board, the semiconductor chip is disposed on the film so that peripheral portions of the semiconductor chip at least on the side of the liquid crystal display panel and the circuit board overlap with a peripheral portion of the opening of the film, and the input terminals and the output terminals of the semiconductor chip are disposed in proximity, such that at least a part of a slanted wiring section of the output side wires is provided in the area where the peripheral portion of the semiconductor chip overlaps with the peripheral portion of the opening of the film.

(2) In order to dispose the input terminals and the output terminals in proximity, the semiconductor chip comprises a latch circuit for primarily latching input imaging data, a selector circuit for converting the imaging data latched by the latch circuit into liquid crystal driving voltage and an output buffer circuit for converting the output from the selector circuit corresponding to liquid crystal alternating signals to an output to the output terminal, and the latch circuit, the selector circuit and the buffer circuit are disposed within the semiconductor chip, so that the signal input from the input terminal flows partially toward the circuit board from the liquid crystal display panel.

(3) In order to dispose the input terminals and the output terminals in proximity, the semiconductor chip comprises a latch circuit for primarily latching input imaging data, a selector circuit for converting the imaging data latched by the latch circuit into liquid crystal driving voltage and an output buffer circuit for converting the output from the selector circuit corresponding to liquid crystal alternating signals to an output to the output terminal, and the selector circuit is disposed on the side of the liquid crystal display panel rather than the output buffer circuit disposed near the output terminal within the semiconductor chip.

(4) In order to dispose the input terminals and the output terminals in proximity, the semiconductor chip comprises a latch circuit for primarily latching input imaging data, a selector circuit for converting the imaging data latched by the latch circuit into liquid crystal driving voltage and an output buffer circuit for converting the output from the selector circuit corresponding to liquid crystal alternating signals to output to the output terminal, and the latch circuit, the selector circuit and the buffer circuit are not disposed between the input terminal and the output terminal.

(5) In order to dispose the input terminals and the output terminals in proximity, a length of the output side wire formed on the film overlapping with the semiconductor chip is set to be longer than a length of the input side wire formed on the film overlapping with the semiconductor chip.

(6) In order to dispose the input terminals and the output terminals in proximity, the plurality of output terminals of the semiconductor chip are provided, on the side of the circuit board of the semiconductor chip, from the middle between the lead of the semiconductor chip on the side of the liquid crystal display panel and the lead of the semiconductor chip on the side of the circuit board.

(7) In order to dispose the input terminals and the output terminals in proximity, the plurality of input terminals and the plurality of output terminals of the semiconductor chip are provided almost on a straight line in the middle or in the area on the side of the circuit board of the semiconductor chip.

(8) The semiconductor chip has a plurality of dummy input terminals which do not contribute to the driving of the liquid crystal and which are connected to a plurality of dummy input side wires provided on the film which do not contribute to the driving of the liquid crystal, and the dummy input terminals are connected with adjoining input terminals for driving the liquid crystal within the semiconductor chip or on the film.

(9) A protecting member is disposed for protecting connecting sections of the input terminals and output terminals of the semiconductor chip with the input side wires and output side wires disposed on the film and suppressing means is provided for suppressing the protecting member from leaking between the semiconductor chip and the film near the semiconductor chip on a face on the opposite side from a face of the film on which the input side wires and the output side wires are disposed.

(10) The semiconductor chip is disposed on the film so that all the peripheral portions thereof overlap with the peripheral portion of the opening of the film in order to reduce the possibility of the protecting member (resin) leaking between the semiconductor chip and the film.

The above-mentioned features allow the width of the tape carrier package to be narrowed to its limit and the architrave area of the liquid crystal display device to be narrowed as a result. These features also make it possible to prevent the semiconductor chip from being destroyed when a signal is input to a plurality of dummy input terminals of the semiconductor chip, thereby improving the accuracy of connection during mounting. Further, it is possible to reduce the possibility of a defective connection caused by the protecting member (resin) leaking to the face opposite from the face on which the input and output side wires are disposed on the film by disposing the film and the semiconductor chip so that they overlap each other.

The foregoing and other objects, advantages, manners of operation and novel features of the present invention will be understood from the following detailed description when read in connection with the accompanying drawings.

Figure 18:
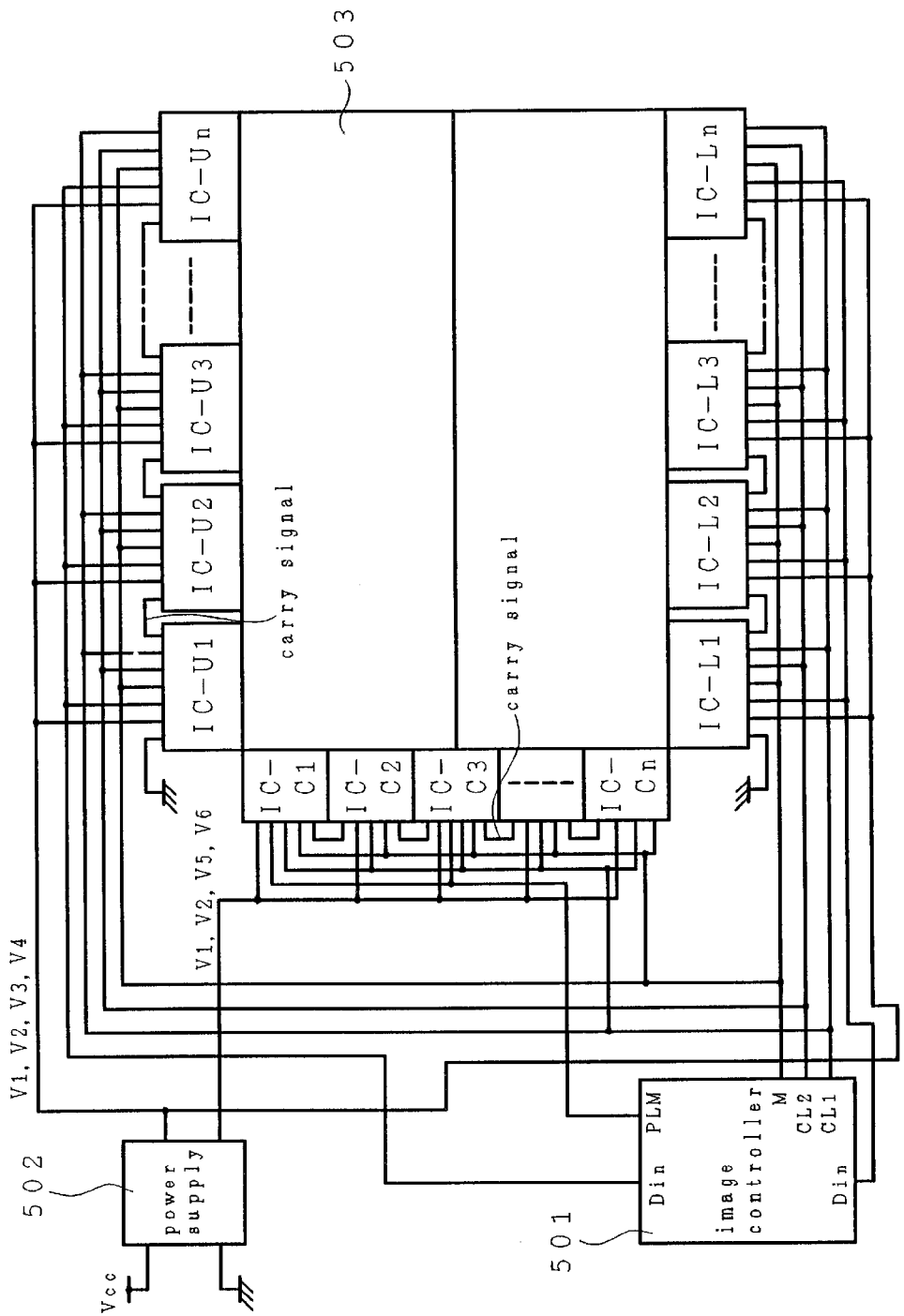
FIG. 18 is a block diagram schematically showing the structure of a prior art color STN type simple matrix liquid crystal display module (LCM) which is one of simple matrix liquid crystal display devices.
Figure 22:
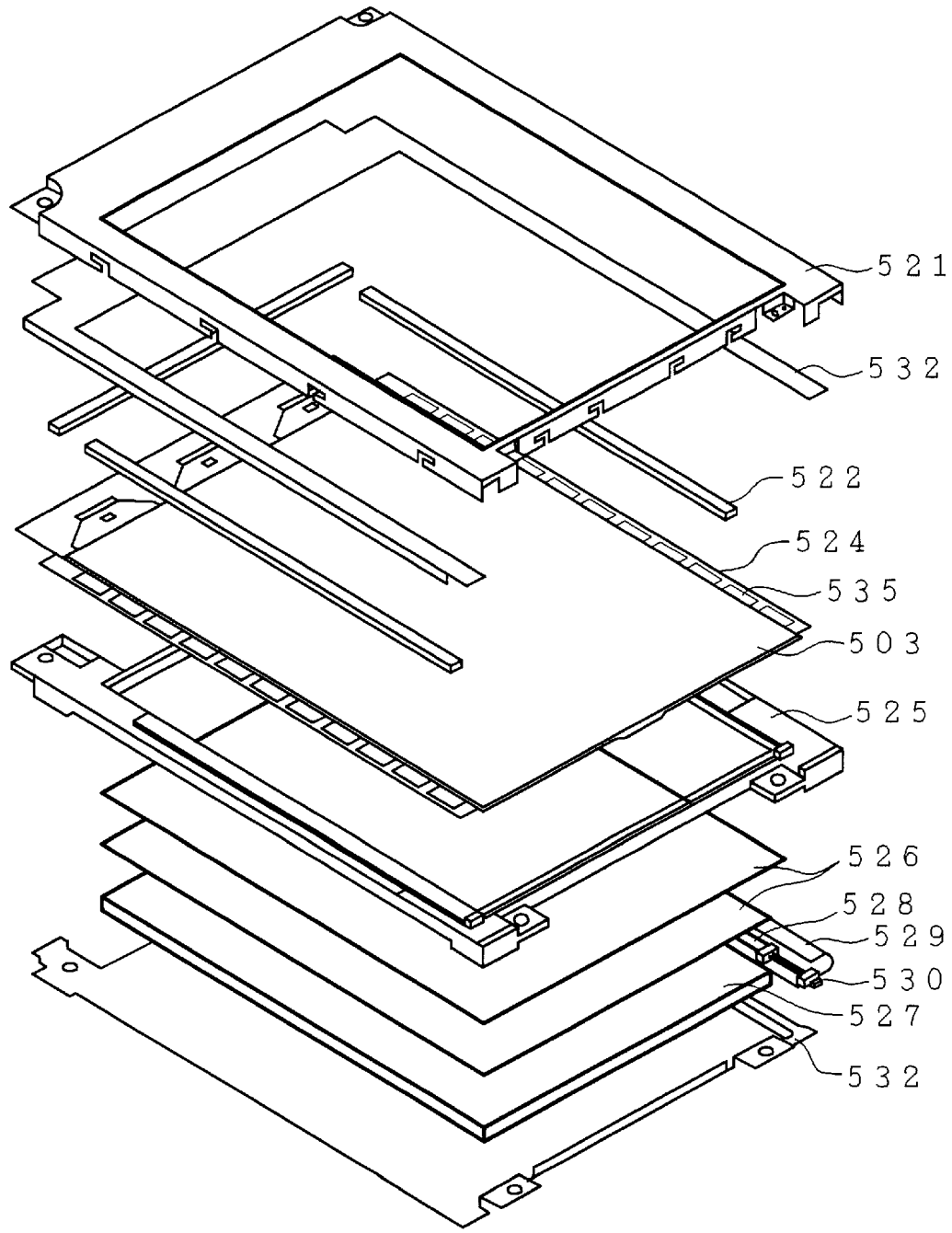
Figure 23:
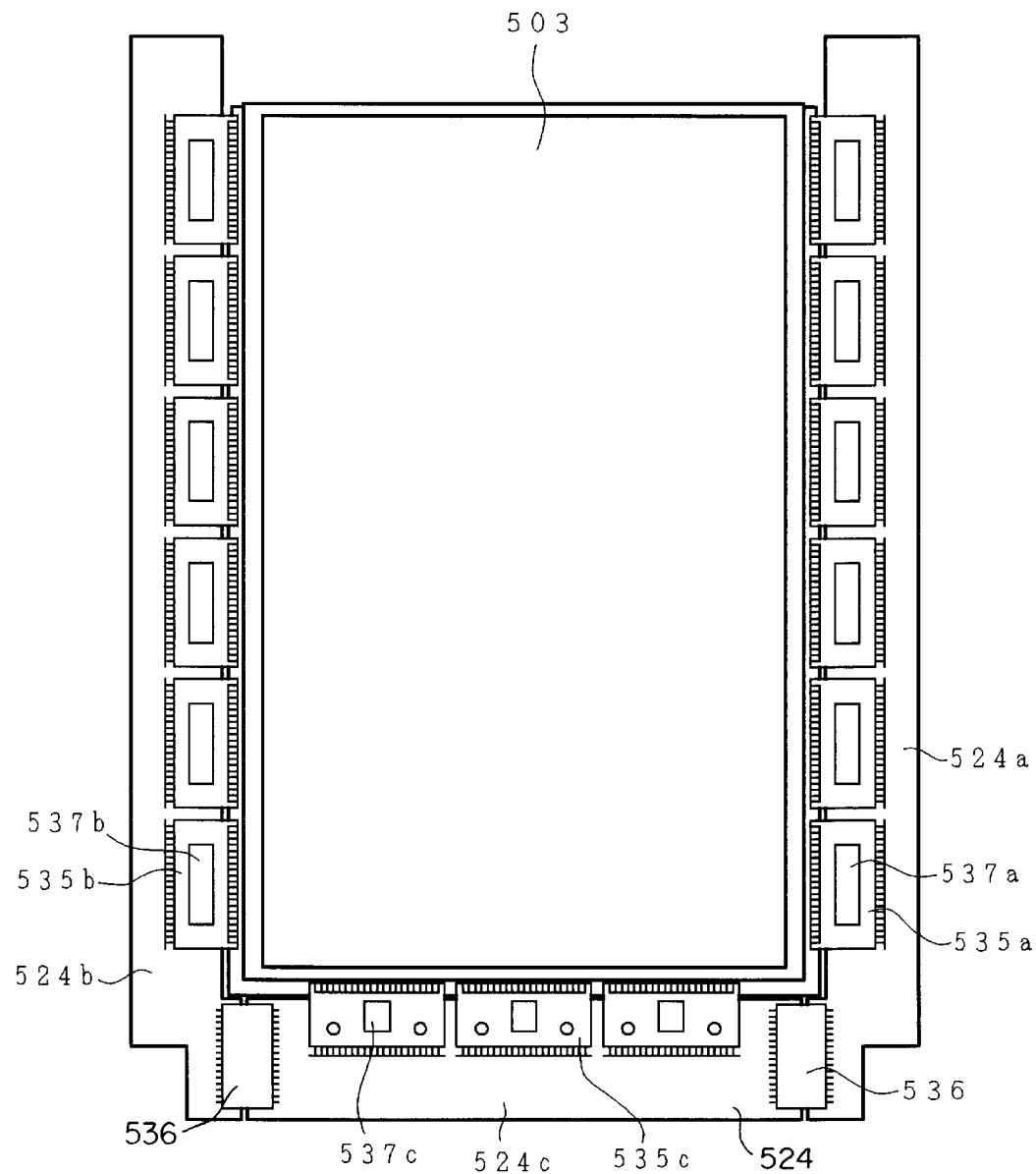

18 and scan signal line driving voltages applied to a common electrode thereof;

FIG. 22 is an exploded perspective view showing components of the simple matrix liquid crystal display module (LCM) shown in FIG. 18;

FIG. 23 is a plan view of the liquid crystal display panel around which driving circuit boards shown in FIG. 18 are mounted;

FIG. 24 is a section view of a tape carrier package shown in FIG. 23; and

FIG. 25(a) is a diagrammatic enlarged view of the tape carrier package shown in FIG. 23 and FIG. 25(b) is a side view thereof.

DESCRIPTION OF PREFERRED EMBODIMENTS

A general explanation of a liquid crystal display module will be presented as a premise for explaining various embodiments of the present invention, and then the embodiments of the invention, in which the present invention is applied to a color STN system simple matrix liquid crystal display module, will be explained individually with reference to the drawings. It is noted that components having the same function in the various views will be denoted by the same reference numerals, and a repeated explanation thereof will be omitted in the explanation of the various embodiments of the invention.

FIG. 18 is a block diagram schematically showing the structure of a color STN (super Twisted Nematic) type simple matrix liquid crystal display module (LCM), which represents one type of simple matrix liquid crystal display device. In the figure, the liquid crystal display module comprises an image controller 501, a power supply 502, a liquid crystal display panel 503, upper drain drivers (data signal line driving circuits) IC-U1, IC-U2, IC-U3 and IC-Un, lower drain drivers (data signal line driving circuits) IC-L1, IC-L2, IC-L3 and IC-Ln and common drivers (scan signal line driving circuits) IC-C1, IC-C2, IC-C3 and IC-Cn.

The liquid crystal display panel 503 comprises a pair of glass substrates disposed so as to face each other through an intermediary layer formed of liquid crystal. There are m common electrodes (scan signal lines) which extend in the X-direction and are disposed in parallel in the Y-direction are formed on a face of one glass substrate on the liquid crystal side, each of which is connected with a corresponding one of the common drivers IC-C1 through Cn. There are n segment electrodes (data signal lines) which extend in the Y-direction and are disposed in parallel in the X-direction are formed on a face of the other glass substrate on the liquid crystal side. The n segment electrodes are divided into two parts including upper and lower segment electrodes, and each of the n segment electrodes divided into two parts is connected with a corresponding one of the upper drain drivers IC-U1 through Un or with a corresponding one of the lower drain drivers IC-L1 through Ln.

Pixel areas are formed at intersections of the above-mentioned plurality of segment electrodes and the above-mentioned plurality of common electrodes. A data signal line driving voltage is applied to the plurality of segment electrodes and a scan signal line driving voltage is applied to the plurality of common electrodes from each of the upper drain drivers IC-U1 through Un, from each of the lower drain drivers IC-L1 through Ln and from each of the common drivers IC-C1 through Cn to drive the pixels. In this case, a so-called alternating driving method for inverting each driving voltage to be applied to the plurality of segment electrodes and the plurality of common electrodes at a predetermined period is adopted so that no DC voltage is applied to the liquid crystal.

The image controller 501 supplies imaging data (Din) to each one of the segment drivers IC-U1 through Un and IC-L1 through Ln based on imaging data transferred from a host computer or the like. The image controller 501 also generates imaging control signals (clock signals CL1, CL2, a frame signal FLM, an alternating signal M and the like) and sends the imaging control signals to each one of the segment drivers IC-U1 through Un and IC-L1 through Ln and each one of the common drivers IC-C1 through Cn to control each one of the segment drivers IC-U1 through Un and IC-L1 through Ln and each one of the common drivers IC-C1 through Cn.

The power supply 502 generates the data signal line driving voltage and the scan signal line driving voltage and supplies the data signal line driving voltage to each one of the segment drivers IC-U1 through Un and IC-L1 through Ln and the scan signal line driving voltage to each one of the common drivers IC-C1 through Cn.

Figure 19:
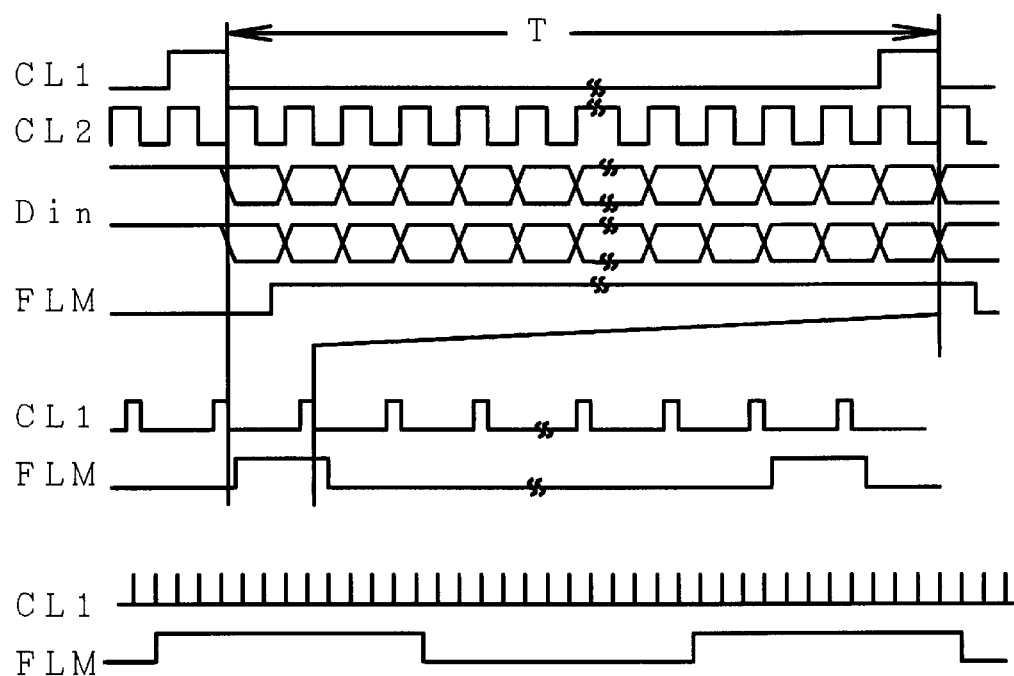
FIG. 19 is a timing diagram showing the timing of display data (Din) and image control signals (clock signals, frame signals and an alternating signal) sent from an image controller shown in FIG. 18 to each segment driver and each common driver.

FIG. 19 is a diagram showing the timing of the imaging data (Din) and the image control signals (the clock signals CL1 and CL2, the frame signal FLM and the alternating signal M) sent from the image controller 501 shown in FIG. 18 to each one of the segment drivers IC-U1 through Un and IC-L1 through Ln and to each one of the common drivers IC-C1 through Cn. It is noted that although imaging control signals other than the clock signals CL1 and CL2, the frame signal FLM and the alternating signal M described above are input from the image controller 501 to each one of the segment drivers IC-U1 through Un and IC-L1 through Ln and to each one of the common drivers IC-C1 through Cn, they are omitted in FIG. 18.

Figure 20:
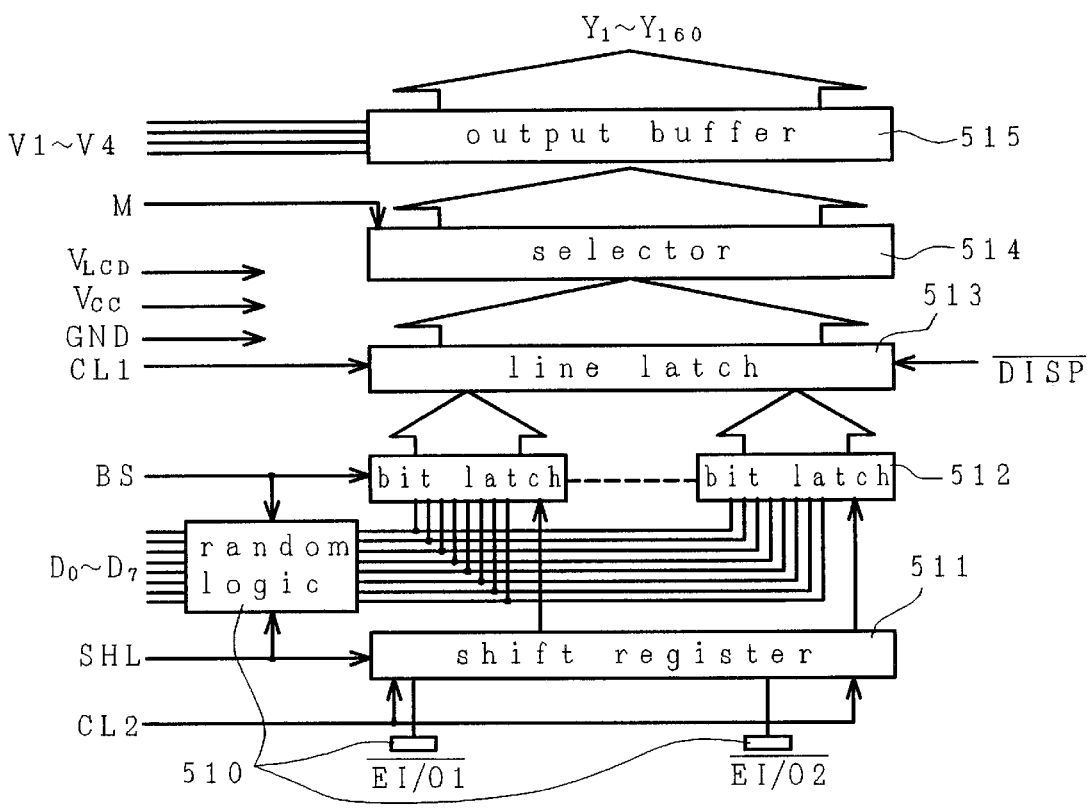
FIG. 20 is a block diagram schematically showing a circuit structure of each segment driver shown in FIG. 18.

FIG. 20 is a block diagram schematically showing an example of the circuit structure of each one of the segment drivers IC-U1 through Un and IC-L1 through Ln shown in FIG. 18. The segment driver shown in FIG. 20 comprises a shift register circuit 511, a bit latch circuit 512, a line latch circuit 513, a selector circuit 514, an output buffer circuit 515 and a random logic circuit 510. In the prior art IC, the driver operates such that a signal input from an input terminal flows to the output terminal in the order of 1) the random logic circuit and the shift register, 2) the line latch circuit, 3) the selector circuit, and 4) the output buffer. That is, basically they are not disposed such that the signal flows from the output terminal side to the input terminal.

The operation of the segment driver shown in FIG. 20 will be explained. The shift register circuit 511 generates a data uptake signal for the bit latch circuit 512 and outputs it to the bit latch circuit 512 based on imaging data latch clock CL2 input from the image controller 501. The bit latch circuit 512 latches the 8 bit imaging data Din input from the image controller 601 based on the data uptake signal input from the shift register circuit 511. The line latch circuit 513 latches the imaging data taken up to all the bit latch circuits 512 and outputs it to the selector circuit 514 based on the output timing control clock signal CL1. The selector circuit 514 converts the voltage level of the imaging data input from the line latch circuit 513 into a high voltage level for driving the liquid crystal and outputs it to the output buffer circuit 515.

While four levels of data signal line driving voltages are being supplied to the output buffer circuit 515 from the power supply 502, the output buffer circuit 515 selects one of the four levels of data signal line driving voltages supplied from the power supply 502 based on the imaging data in the high voltage level input from the selector circuit 514 and the alternating signal M and outputs it to each segment electrode (data signal line). At this time, each of the segment drivers IC-U1 through Un and IC-L1 through Ln outputs a carry signal bar EI/01 or bar EI/02 and the previous carry signal is input to a carry input of the next one of the segment drivers IC-U1 through Un and IC-L1 through Ln as it is. The carry signal allows the imaging data uptake operation of each of the segment drivers IC-U1 through Un and IC-L1 through Ln to be controlled and to prevent erroneous imaging data from being taken up by each one of the segment drivers IC-U1 through Un and IC-L1 through Ln.

The output terminal of the output buffer circuit 515 is reversed from right to left, and vice versa, when the segment driver shown in FIG. 20 is disposed on the liquid crystal display panel 503 or under the liquid crystal display panel 503, so that the data signal line driving voltage from the output buffer circuit 515 output to each segment electrode must be reversed from right to left, and vice versa. The random logic circuit 510 shown in FIG. 20 rearranges the 8 bit imaging data Din input from the image controller 501 when the data signal line driving voltage from the output buffer circuit 515 output to each segment electrode is reversed from right to left, and vice versa (SHL).

Four levels of scan signal line driving voltages are being supplied to each of the common drivers IC-C1 through Cn shown in FIG. 18 and each of the common drivers IC-C1 through Cn selects the common electrode to be driven per one horizontal scan time by an internal logic circuit based on the frame signal FLM and the clock signal CL1 supplied from the image controller 501 and selects and outputs one of the four levels of the scan signal line driving voltages supplied from the power supply 502 to the selected common electrode and to common electrodes other than that based on the alternating signal M. At this time, each of the common drivers IC-C1 through Cn outputs a carry signal. The previous carry signal is input to a carry input of the next one of the common drivers IC-C1 through Cn as it is. The carry signal allows the common electrode selecting operation of each of the common drivers IC-C1 through Cn to be controlled.

Figure 21:
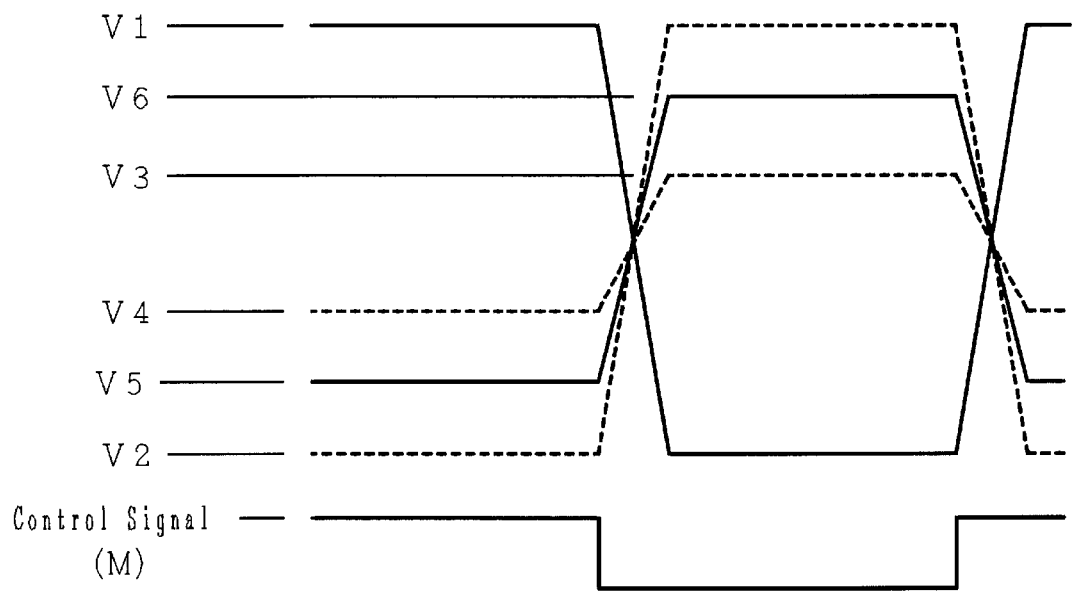
FIG. 21 is a signal diagram for explaining one example of data signal line driving voltages applied to a segment electrode of the liquid crystal display panel shown in FIG.

FIG. 21 is a chart for explaining one example of the data signal line driving voltages applied to the segment electrodes of the liquid crystal display panel 503 shown in FIG. 18 and the scan signal line driving voltages applied to the common electrodes thereof. In the example shown in FIG. 21, the power supply 502 generates voltages V1 through V6 which are different from each other and supplies the voltages V1, V2, V3 and V4 to each one of the segment drivers IC-U1 through Un and IC-L1 through Ln and supplies the voltages V1, V2, V5 and V6 to each one of the common drivers IC-C1 through Cn respectively.

When the alternating signal M is at the High level, for example as shown in FIG. 21, the driving voltage V2 supplied from the power supply 502 is applied to each segment electrode whose imaging data is "1" and the driving voltage V4 supplied from the power supply 502 is applied to each segment electrode whose imaging data is "0". When the alternating signal M is at the Low level, the driving voltage V1 supplied from the power supply 502 is applied to each segment electrode whose imaging data is "1" and the driving voltage V3 supplied from the power supply 502 is applied to each segment electrode whose imaging data is "0". Similarly to that, when the alternating signal M is at the High level, the driving voltage V1 supplied from the power supply 502 is applied to the selected common electrode and the driving voltage V5 supplied from the power supply 502 is applied to the non-selected common electrode. Further, when the alternating signal M is at the Low level, the driving voltage V2 supplied from the power supply 502 is applied to the selected common electrode and the driving voltage V6 supplied from the power supply 502 is applied to the non-selected common electrode.

FIG. 22 is an exploded perspective view showing components of the simple matrix liquid crystal display module (LCM) shown in FIG. 18. In the liquid crystal display module shown in FIG. 18, a cold cathode ray tube 528, a light conducting plate assembly 527 for irradiating light from the cold cathode ray tube 528 to the liquid crystal display panel 503, a prism sheet 526 for condensing light from the light conducting plate assembly 527 and a lower frame 532, in which white paint is applied on a metal plate, are fitted into a window section of a mold 525 formed into the shape of a frame in the order shown in FIG. 22. Here, the light conducting plate assembly 527 comprises a light conducting plate made of an acrylic plate and a reflecting sheet and a diffusing sheet formed on both sides of the light conducting plate.

A silver reflecting sheet 529 for condensing light emitted in a direction different from that of the light conducting plate assembly 527 to the light conducting plate assembly 527 without waste of the light is disposed around the cold cathode ray tube 528. Driving circuit boards 524 are mounted around the liquid crystal display panel 503 and tape carrier packages 535 are mounted on the driving circuit boards 524.

The liquid crystal display module shown in FIG. 18 is assembled by placing the liquid crystal display panel 503 around which the driving circuit boards 524 are mounted on the window section of the mold 525, by piling up silicon spacers 522, a rod spacer 532 and an upper frame 521 having a display window thereon and by pinching the lower frame using clips provided around the upper frame 521. Here, the mold 525, the prism sheet 526, the cold cathode ray tube 528, the silver reflecting sheet 529, the light conducting plate assembly 527 and the lower frame 532 compose a back light for irradiating light to the liquid crystal display panel 503. It is noted that the reference numeral 530 in FIG. 22 denotes a rubber bush. Thus, the simple matrix liquid crystal display module shown in FIG. 18 comprises the liquid crystal display panel 503 around which the driving circuit boards 524 are mounted and the back light stored between the upper frame 521 having the display window and the lower frame 532.

The area of the display window of the upper frame 521 constitutes the display area of the simple matrix liquid crystal display module and the area other than the display area of the simple matrix liquid crystal display module, i.e. the area around the display window of the upper frame 521, which is normally called an architrave, and the tape carrier packages 535 and the driving circuit boards 524 are stored in the architrave area, as is apparent from FIG. 22.

The present invention is applied to such a liquid crystal display module and may be clearly understood from the following embodiments.

[First Embodiment]

The structure of the color STN type simple matrix liquid crystal display module forming a first embodiment of the present invention is the same as that of the general color STN type simple matrix liquid crystal display module shown in FIG. 18, so that its detailed explanation will be omitted here. It is noted, however, that the driving method of the color STN type simple matrix liquid crystal display module of the first embodiment is not limited only to the voltage averaging method.

Figure 1:
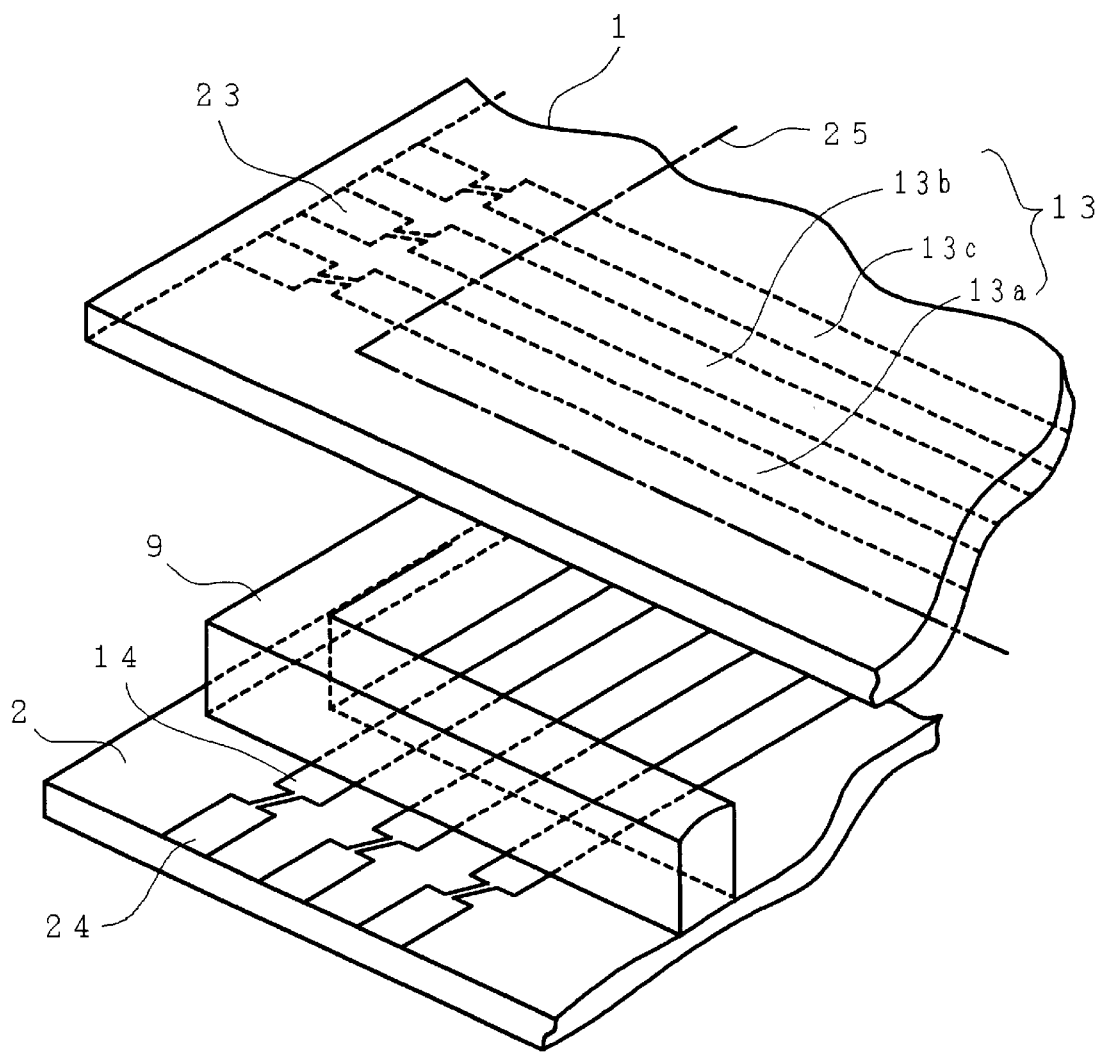
FIG. 1 is an exploded perspective view showing components of a liquid crystal display panel used in a color STN (Super Twisted Nematic) type simple matrix liquid crystal display module according to one embodiment (first embodiment) of the present invention.
Figure 2:
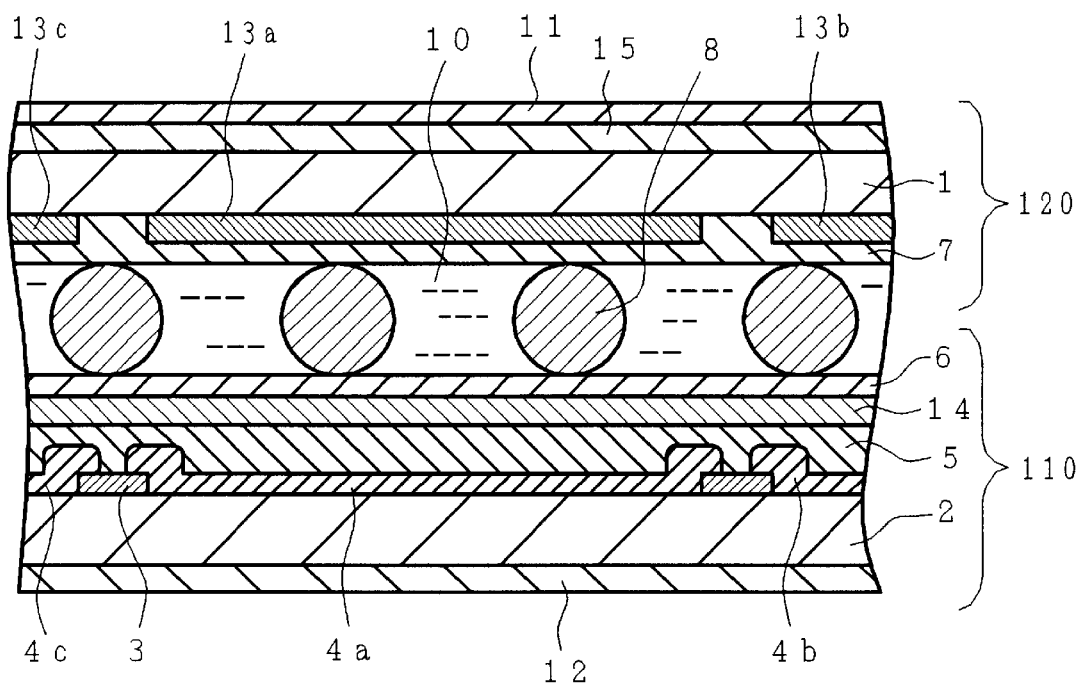
FIG. 2 is a section view of a main part of the liquid crystal display panel shown in FIG. 1.

FIG. 1 is an exploded perspective view showing components of a liquid crystal display panel as used in the color STN type simple matrix liquid crystal display module forming one embodiment (first embodiment) of the present invention, and FIG. 2 is a section view of a main part of the liquid crystal display panel shown in FIG. 1. As shown in FIG. 1 or 2, a plurality of segment electrodes (data signal lines) 13 made of a belt-like transparent conductive film (ITO) are formed on a glass substrate 1, on the side of a liquid crystal layer 10, and a plurality of common electrodes (scan signal lines) 14 made of a belt-like transparent conductive film (ITO) are formed on a glass substrate 2 in a liquid crystal display panel 100 of the first embodiment of the present invention.

The plurality of segment electrodes 13 and an orientation film 7 are laminated on the inside of the glass substrate 1 (on the side of the liquid crystal layer 10 thereof) and color filters 4a, 4b and 4c, a dousing film 3, a protecting film 5, the plurality of common electrodes 14 and an orientation film 6 are laminated sequentially on the inside of the glass substrate 2 (on the side of the liquid crystal layer 10 thereof). A polarizing plate 11 and a phase contrast plate 15 are formed on the outside of the glass substrate 1 and a polarizing plate 12 is formed on the outside of the glass substrate 2.

An area 25 in FIG. 1 indicates an area where the polarizing plate 11 and the phase contrast plate 15 are formed on the outside of the glass substrate 1. The common electrodes 14 and the segment electrodes 13 cross at right angles to each other and each intersection thereof constitutes one pixel. The segment electrode 13 and the common electrode 14 are extended to one end of the glass substrate 1 and the glass substrate 2, respectively, forming terminals 23 and 24 for electrical connection to a segment driver and a common driver, respectively. Here, the segment electrodes 13 include segment electrodes 13a, 13b and 13c for the R (red), G (green) and B (blue) colors, respectively. Further, the grid-like dousing film 3 is formed so as to surround the color filters 4a, 4b and 4c. Therefore, the grid-like dousing film 3 is disposed between the common electrodes 14 and between the segment electrodes 13 at facing positions. Spacers 8 for keeping the thickness of the liquid crystal layer 10 uniform are also concealed in the liquid crystal layer 10 as shown in FIG. 2.

It is noted that the glass substrate 2, the dousing film 3, the color filters 4a, 4b and 4c, the protecting film 5, the plurality of common electrodes 14, the orientation film 6 and the polarizing plate 12 form a common electrode substrate 110, and the glass substrate 1, the plurality of segment electrodes 13, the orientation film 7, the polarizing plate 11 and the phase contrast plate 15 form a segment electrode substrate 120.

The liquid crystal display panel 100 of the first embodiment of the present invention is fabricated through the following steps:

(1) After fabricating the common electrode substrate 110 and the segment electrode substrate 120 separately, a sealing member 9 is formed around the common electrode substrate 110 and the spacers 8 are disposed within the sealing member 9;

(2) The face of the pattern of the common electrode substrate 110 is mated with that of the segment electrode substrate 120 and the sealing member 9 is hardened by heating while pressurizing the outer faces of the common electrode substrate 110 and the segment electrode substrate 120 to bond and seal the common electrode substrate 110 and the segment electrode substrate 120;

(3) Liquid crystal is injected from an opening in the sealing member, the opening is sealed by epoxy resin or the like, and finally, the phase contrast plate 15 and the polarizing plates 11 and 12 are pasted on the glass substrates 1 and 2, respectively.

Figure 3:
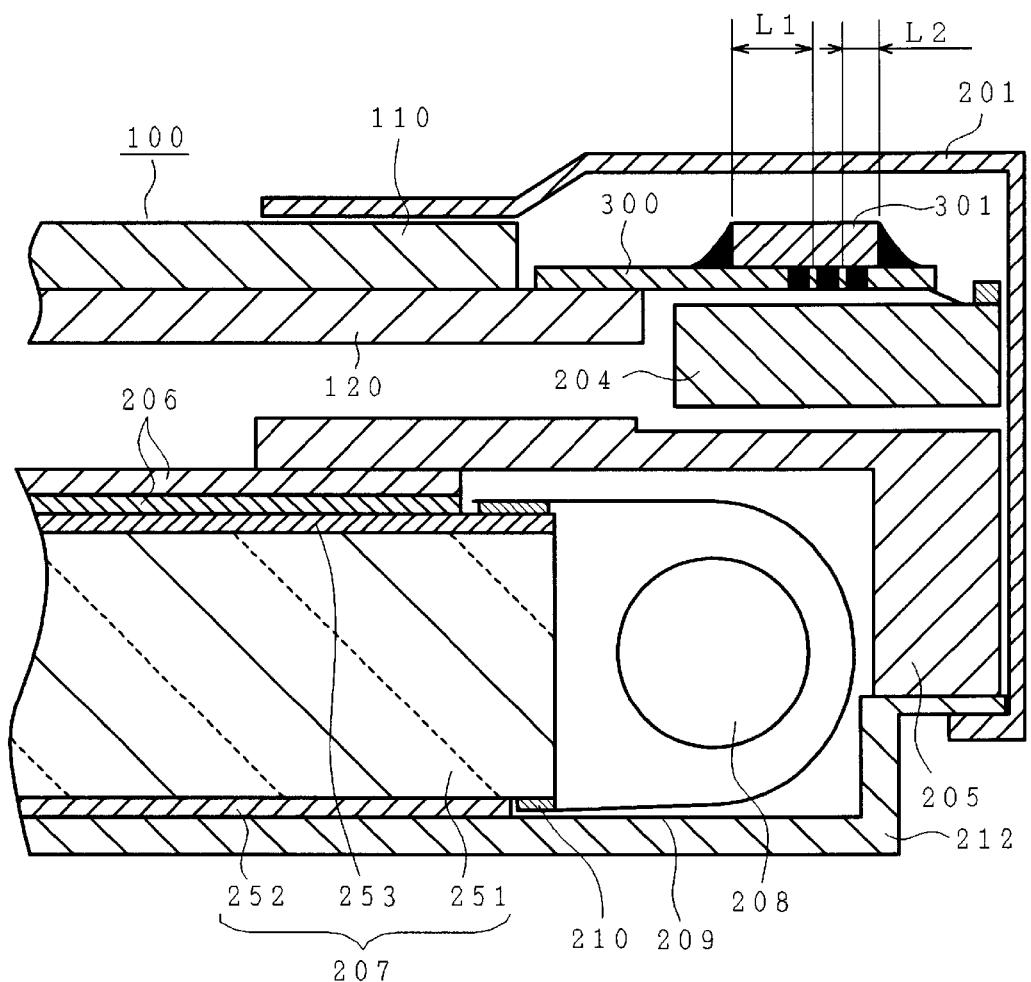
FIG. 3 is a schematic section view of a peripheral portion of a liquid crystal module (LCM) of the first embodiment of the present invention.

FIG. 3 is a schematic section view of a peripheral portion of the liquid crystal module (LCM) of the first embodiment of the present invention, showing a section thereof on the side where a cold cathode ray tube is disposed (on the side where the cold cathode ray tube 528 in FIG. 22 is disposed). As in the prior art simple matrix liquid crystal display module shown in FIG. 18, driving circuit boards also are mounted around the liquid crystal display panel 100 shown in FIG. 1 or 2 in the simple matrix liquid crystal display module of the first embodiment of the present invention. The driving circuit boards are divided into three parts which are provided along respective sides of the liquid crystal display panel 100. Each driving circuit board is electrically connected to another board by a flat cable. Tape carrier packages and electronic parts, such as a resistor and a capacitor, are mounted on each of the driving circuit boards, and an IC chip for driving the liquid crystal panel 100 is mounted on the tape carrier package by tape automated bonding (TAB).

FIG. 3 shows only the driving circuit board 204 and the tape carrier package 300 provided on (or under) the liquid crystal display panel 100. The IC chip 301 is mounted on the tape carrier package 300. As in the prior art simple matrix liquid crystal display module shown in FIG. 18, the simple matrix liquid crystal display module of the first embodiment of the present invention is assembled by placing the liquid crystal display panel 100 shown in FIG. 1 or 2, around which the driving circuit board 204 and the other two driving circuit boards are mounted, on a back light, by piling up silicon spacers not shown, a rod spacer not shown and an upper frame 201 having a display window thereon and by pinching a lower frame 212 by clips provided around an upper frame 201. Further, as in the simple matrix liquid crystal display module shown in FIG. 18, a cold cathode ray tube 208, a light conducting plate assembly 207 for irradiating light from the cold cathode ray tube 208 to the liquid crystal display panel 100, a prism sheet 206 for condensing light from the light conducting plate assembly 207 and the lower frame 212, in which white paint is applied on a metal plate, are fitted into the window section of a mold 205 formed into the shape of a frame in the order shown in FIG. 22.

A silver reflecting sheet 209, for condensing light emitted in a direction away from the light conducting plate assembly 207 and directing the light toward the light conducting plate assembly 207 to avoid a waste of the light, is disposed around the cold cathode ray tube 208. Here, the light conducting plate assembly 207 comprises a light conducting plate 251 made of an acrylic plate, a reflecting sheet 252 and a diffusing sheet 253 formed on the both sides of the light conducting plate. The mold 205, the prism sheet 206, the cold cathode ray tube 208, the silver reflecting sheet 209, the light conducting plate assembly 207 and the lower frame 212 form a back light. It is noted that the reference numeral 201 in FIG. 3 denotes a double stick tape for bonding the silver reflecting sheet 209 and the light conducting plate assembly 207.

Figure 4:
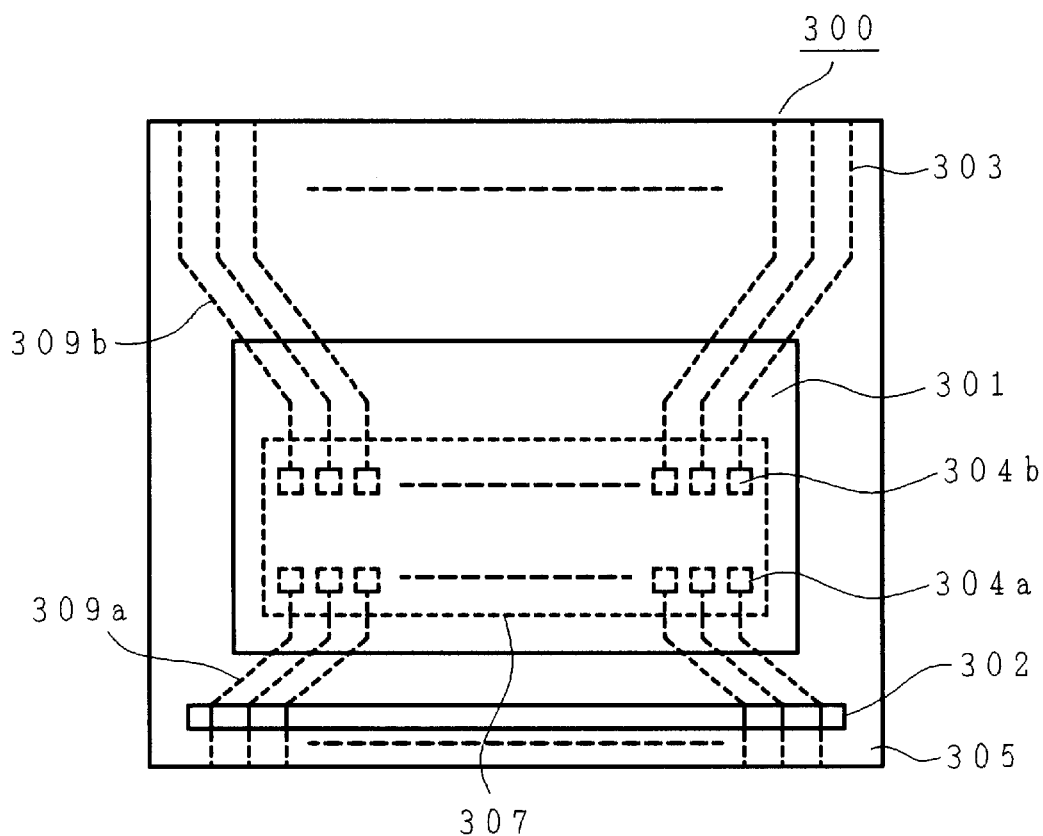
FIG. 4 is a schematic plan view of a tape carrier package of the first embodiment of the present invention.
Figure 5:
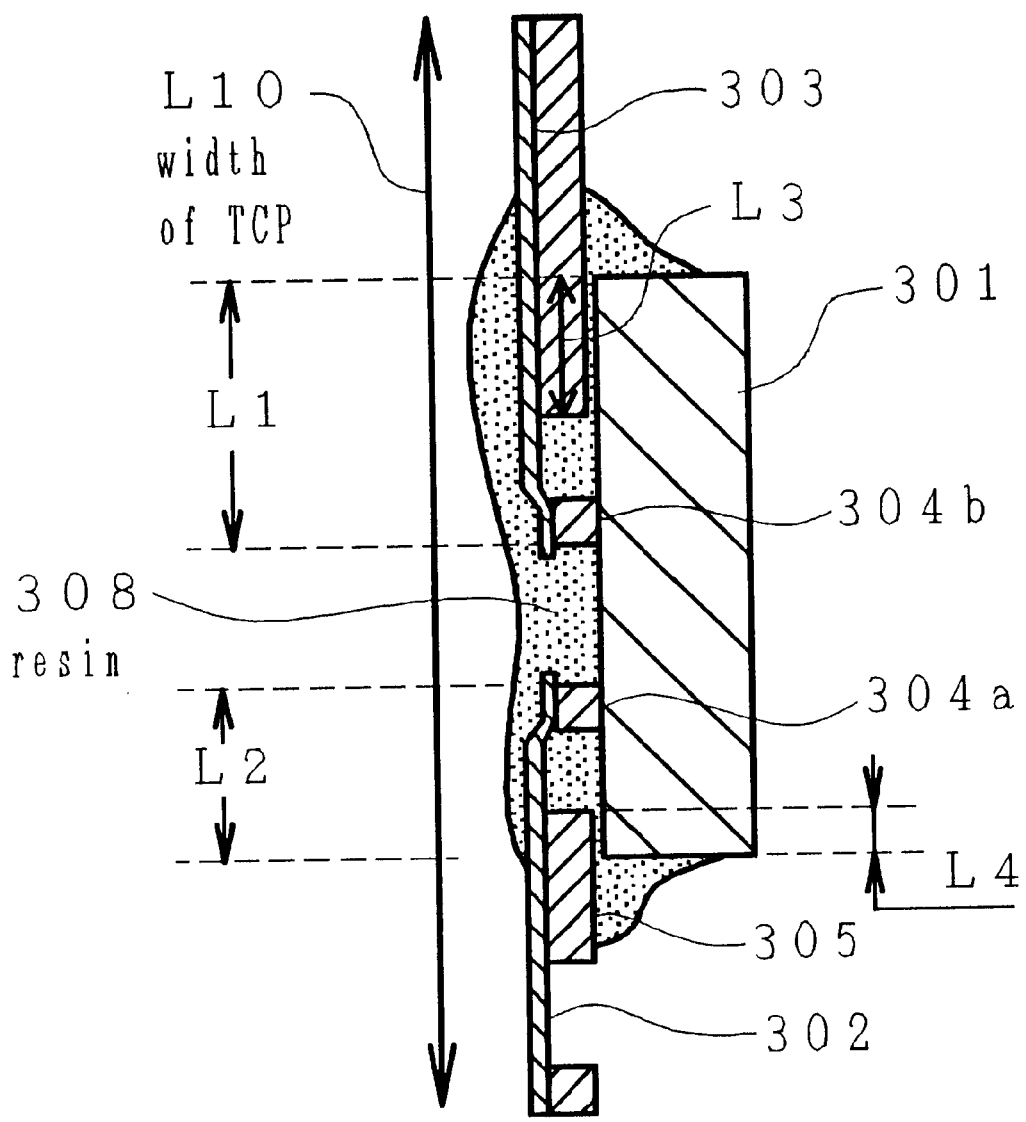
FIG. 5 is a schematic section view of the tape carrier package of the first embodiment of the present invention.

FIG. 4 is a schematic plan view of the tape carrier package 300 of the first embodiment of the present invention, and FIG. 5 is a schematic section view thereof. It is noted that the tape carrier package 300 of the first embodiment of the present invention constitutes each of the segment drivers IC-U1 through Un and IC-L1 through Ln shown in FIG. 18 or FIG. 20.

In FIGS. 4 and 5, the reference numeral 302 denotes an input side wiring section of the IC chip 301 and 303 denotes an output side wiring section thereof. An input side bonding pad 304a of the IC chip 301 is connected with an inner lead of the input side wire 302 and an output side bonding pad 304b is connected with an inner lead of the output side wire 303, respectively, by a so-called gang bonding method. Here, the input side wire 302 and the output side wire 303 are made of copper (Cu) for example. An outer lead of the input side wire 302 its connected with a terminal of the driving circuit board by soldering or the like and an outer lead of the output side wire 303 is connected with a terminal 23 of the liquid crystal panel 100 by an anisotropic conductive film.

Slanted wiring sections 309a and 309b are provided in the input side wire 302 and the output side wire 303 in order to adjust the pitches at each lead of the input side wire 302 and the output side wire 303 as shown in FIG. 4. A base film 305, made of polyimide or the like, is provided with an opening 307 and is bonded with the input side wire 302 and the output side wire 303 by adhesive. While not shown in FIG. 4, thermosetting resin 308 is provided to protect the IC chip 301.

As shown in FIG. 4, the tape carrier package 300 of the first embodiment is arranged such that the peripheral portion of the IC chip 301 overlaps with an edge of the opening 307 of the base film 305 and the output side bonding pad 304b of the IC chip 301 is provided at the middle portion of the wires (the input side wire 302 and the output side wire 303) of the tape carrier package 300 in the wiring direction. That is, the tape carrier package 300 of the first embodiment is arranged such that a length L3 of the peripheral portion of the IC chip 301 on the side of the liquid crystal display panel 100 overlapping with the edge of the opening 307 of the base film 305 is longer than a length L4 of the peripheral portion of the IC chip 301 on the side of the driving circuit board 204 overlapping with the edge of the opening 307 of the base film 305, and a distance L1 from the end of the IC chip 301 on the side of the liquid crystal display panel 100 (the side of the outer lead of the output side wire 303 of the tape carrier package 300) is greater than a distance L2 from the end of the IC chip 301 on the side of the driving circuit board 204 (the side of the outer lead of the input side wire 302 of the tape carrier package 300) to the input side bonding pad 304a of the IC chip 301.

Figure 6:
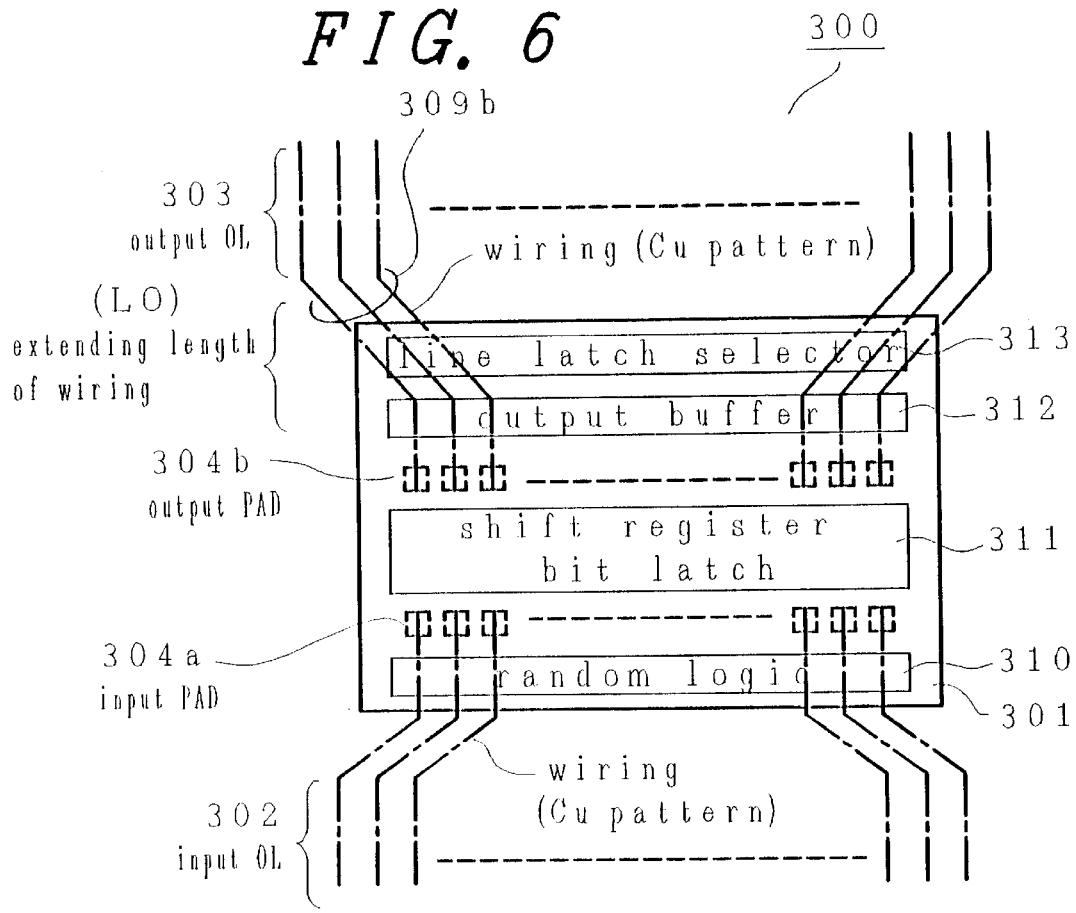
FIG. 6 is a diagram schematically showing a structure of an internal circuit of an IC chip mounted on the tape carrier package of the first embodiment of the present invention in combination with a wiring pattern thereof.

FIG. 6 is a diagram schematically showing a structure of an internal circuit of the IC chip 301 mounted on the tape carrier package 300 of the first embodiment of the present invention in combination with a wiring pattern thereof. As shown in FIG. 6, the internal circuit of the IC chip 301 mounted on the tape carrier package 300 of the first embodiment is not provided along the flow of signals (data). That is, there are provided, in order, a random logic circuit 310, the input side bonding pad 304a, a shift register circuit and bit latch circuit 311, the output side bonding pads 304b, an output buffer circuit 312, and a line latch and selector circuit 313. Here, taking a disconnection of the wiring pattern of the output side wire 303 during etching and a short circuit of the adjoining wiring patterns into consideration, an extending length L0 of the slanted wire 309b of the output side wire 303 of the tape carrier package 300 is presented by the following expressions (1) and (2):

$$L0 = (OL/2 - \frac{1}{4}) \yen (OLP - OPP) \tan(q) \quad (1)$$

$$q = \sin^1(RP/OLP) \quad (2)$$

where, OL is the number of output side wires 303, OLP is the pitch of the outer leads of the output side wires 303, OPP is the pitch of the output side bonding pads 304b of the IC chip 301 and RP is the wiring pitch of the slanted wires 309b.

As is apparent from the above-mentioned expressions (1) and (2), when the size of a display screen of the liquid crystal display device, such as a simple matrix liquid crystal display module, is increased, the pitch size of the outer leads of the output side wires 303 increases and the wire extending length L0 of the slanted wires 309b of the output side wires 303 of the tape carrier package 300 increases. The same applies also when the size of the IC chip 301 is reduced and the pitch size of the inner leads of the output side wires 303 of the tape carrier package 300 is reduced. However, because the output side bonding pad 304b of the IC chip 301 is provided at the middle portion of the wires in the wiring direction of the tape carrier package 300 in the tape carrier package 300 of the first embodiment, it is possible to prolong the distance L1 from the end of the IC chip 301 on the side of the liquid crystal display panel 100 to the output side bonding pad 304b of the IC chip 301.

Because it is possible to provide the slanted wire 309b of the output side wire 303 of the tape carrier package 300 at a position overlapping with the IC chip 301, the width of the tape carrier package 300 in the wiring direction (TCP width; L10) may be narrowed. Accordingly, the use of the tape carrier package 300 of the first embodiment allows the width of the upper and lower architrave areas of the liquid crystal display module to be narrowed.

A predetermined etching space is necessary between each lead in forming the inner leads of the input side wire 302 of the tape carrier package 300 and the inner lead of the output side wire 303 by etching and a predetermined interval is necessary between the input side bonding pad 304a and the output side bonding pad 304b of the IC chip 301. However, because the shift register circuit and bit latch circuit 311 is disposed between the input side bonding pad 304a and the output side bonding pad 304b of the IC chip 301 in the tape carrier package 300 of the first embodiment, the width of the tape carrier package 300 in the wiring direction of the IC chip 301 may be narrowed by effectively utilizing the IC chip 301.

[Second Embodiment]

Figure 7:
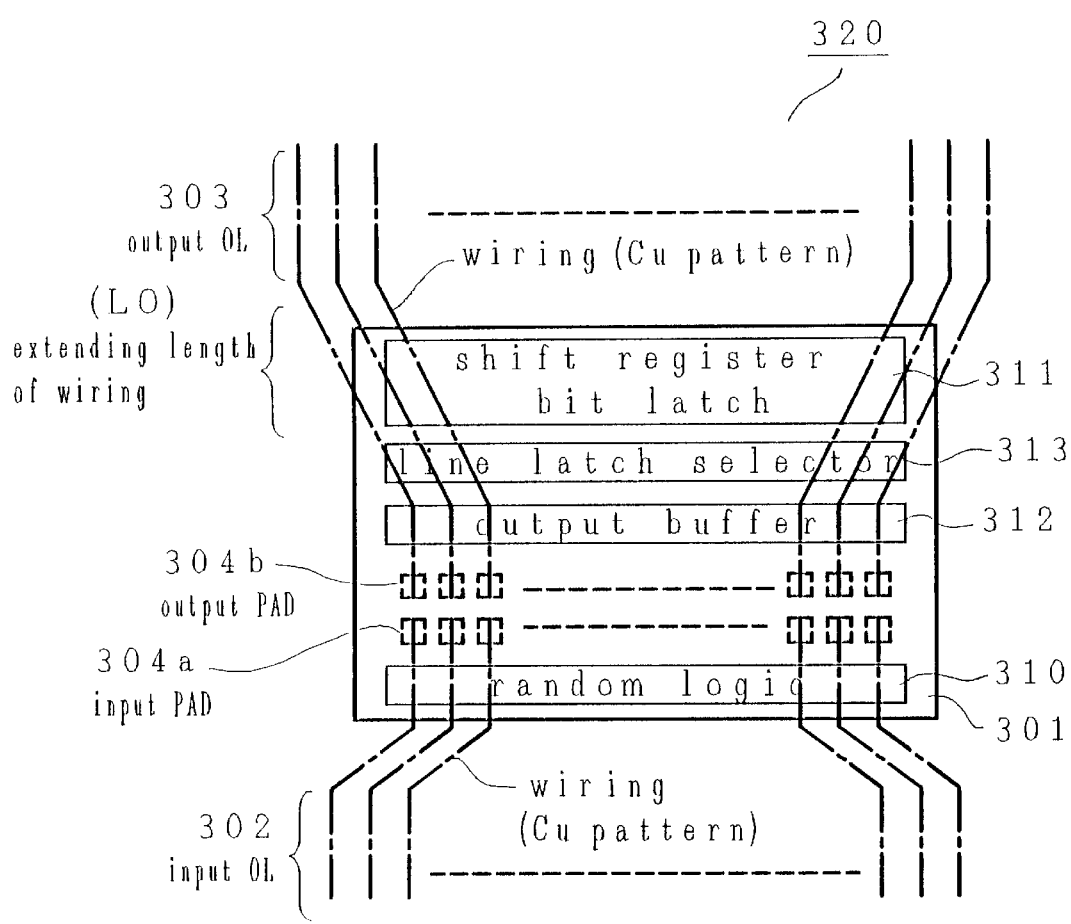
FIG. 7 is a diagram schematically showing a structure of an internal circuit of an IC chip mounted on a tape carrier package of a second embodiment of the present invention in combination with a wiring pattern thereof.

The color STN type simple matrix liquid crystal display module forming the second embodiment of the present invention is different from the simple matrix liquid crystal display module of the first embodiment in the structure of the IC chip mounted on the tape carrier package. FIG. 7 is a diagram schematically showing the structure of an internal circuit of an IC chip 321 mounted on a tape carrier package 320 of the second embodiment of the present invention in combination with a wiring pattern thereof.

It is noted that the tape carrier package 320 shown in FIG. 7 is a tape carrier package provided on (or under) the liquid crystal display panel. The tape carrier package 320 of the second embodiment is also arranged such that the IC chip 321 overlaps with the edge of the opening of the base film 305 at the peripheral portion thereof. Further, as shown in FIG. 7, the output side bonding pad 304b of the IC chip 321 is provided in proximity to the input side bonding pad 304a of the IC chip 321 on the side of the driving circuit board 204 of the IC chip 321 from the middle of the wiring section in the wiring direction of the tape carrier package 320 (on the side of the outer lead of the input side wire 302 of the tape carrier package 320). Corresponding to that, the internal circuit of the IC chip 321 mounted on the tape carrier package 320 of the second embodiment is not provided along the flow of signals (data). That is, as shown in FIG. 7, there are provided, in order, the random logic circuit 310, the input side bonding pad 304a, the output side bonding pad 304b, the output buffer circuit 312, the line latch and selector circuit 313, and the shift register and bit latch circuit 311.

The distance L1 from the end of the IC chip 321 on the side of the liquid crystal display panel 100 to the output side bonding pad 304b of the IC chip 321 is increased more than the distance L2 from the end of the IC chip 321 on the side of the driving circuit board 204 to the input side bonding pad 304a of the IC chip 321 also in the tape carrier package 320 of the second embodiment. Because it allows the slanted wiring section 309b of the output side wire 303 of the tape carrier package 320 to be provided at the position overlapping with the IC chip 321, the width of the tape carrier package 320 in the wiring direction (TCP width; L10) may be narrowed. Accordingly, the use of the tape carrier package 320 of the second embodiment allows the width of the upper and lower architrave areas of the liquid crystal display module to be narrowed.

[Third Embodiment]

Figure 8:
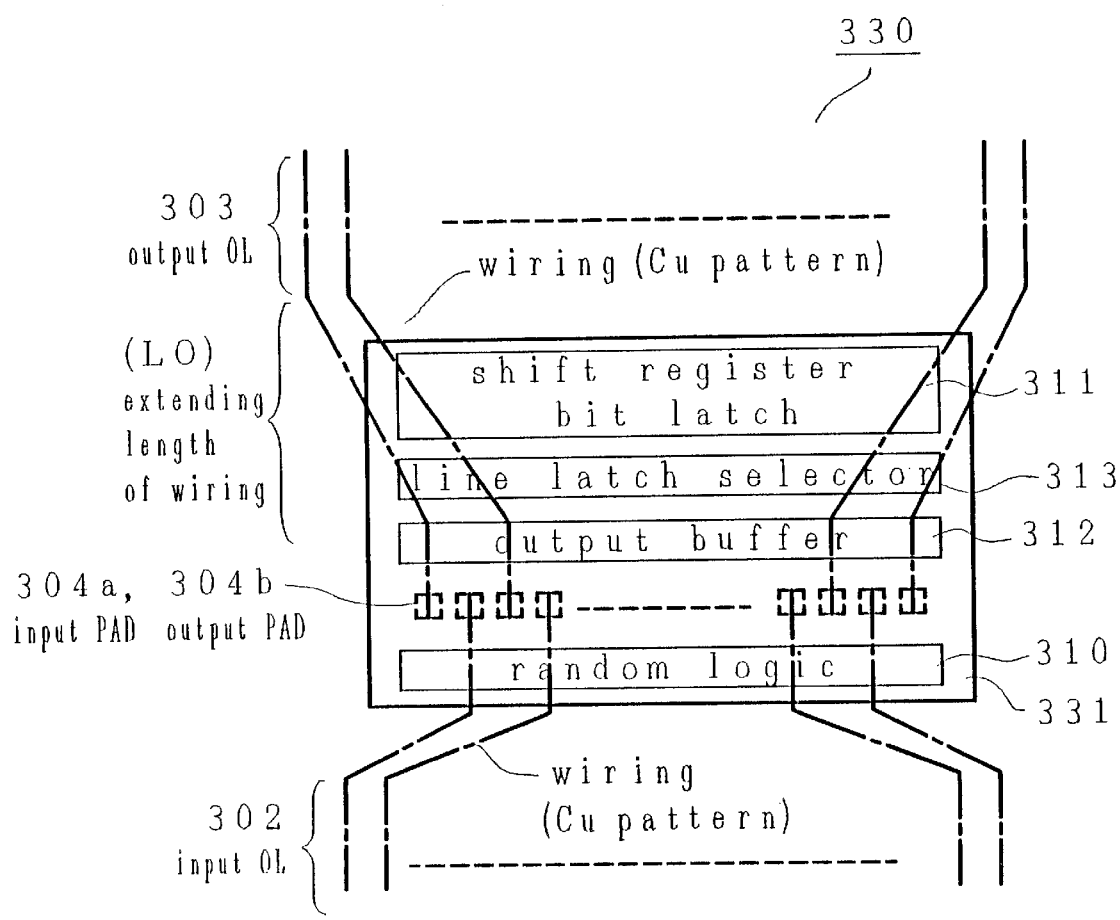
FIG. 8 is a diagram schematically showing a structure of an internal circuit of an IC chip mounted on a tape carrier package of a third embodiment of the present invention in combination with a wiring pattern thereof.

The color STN type simple matrix liquid crystal display module representing the third embodiment of the present invention is different from the simple matrix liquid crystal display module of the first embodiment in the structure of the IC chip mounted on the tape carrier package. FIG. 8 is a diagram schematically showing a structure of an internal circuit of an IC chip 331 mounted on a tape carrier package 330 of the third embodiment of the present invention in combination with a wiring pattern thereof.

It is noted that the tape carrier package 330 shown in FIG. 8 is a tape carrier package provided on (or under) the liquid crystal display panel. The tape carrier package 330 of the third embodiment is also arranged such that the IC chip 331 overlaps with the edge of the opening of the base film 305 at the peripheral portion thereof. Further, as shown in FIG. 8, the output side bonding pad 304b of the IC chip 331 is provided at the same position with the input side bonding pad 304a of the IC chip 331 on the side of the driving circuit board 204 of the IC chip 331 from the middle of the wiring section in the wiring direction of the tape carrier package 330 (on the side of the outer lead of the input side wire 302 of the tape carrier package 330). Corresponding to that, the internal circuit of the IC chip 331 mounted on the tape carrier package 330 of the third embodiment is not provided along the flow of signals (data). That is, as shown in FIG. 8, there are provided, in order, the random logic circuit 310, the input side bonding pad 304a, the output side bonding pad 304b, the output buffer circuit 312, the line latch circuit and selector circuit 313, and the shift register circuit and bit latch circuit 311.

The distance L1 from the end of the IC chip 331 on the side of the liquid crystal display panel 100 to the output side bonding pad 304b of the IC chip 331 is increased more than the distance L2 from the end of the IC chip 331 on the side of the driving circuit board 204 to the input side bonding pad 304a of the IC chip 331 also in the tape carrier package 330 of the third embodiment. Because it allows the slanted wiring section 309b of the output side wire 303 of the tape carrier package 330 to be provided at the position overlapping with the IC chip 331, the width of the tape carrier package 330 in the wiring direction (TCP width; L10) may be narrowed. Accordingly, the use of the tape carrier package 330 of the third embodiment allows the width of the upper and lower architrave areas of the liquid crystal display module to be narrowed. Further, because no space for setting the output side bonding pad 304b is necessary in the tape carrier package 330 of the third embodiment, the width of the IC chip 331 may be narrowed and the use of the tape carrier package 330 of the third embodiment allows the width of the architrave area other than the display area of the liquid crystal display module to be narrowed further.

[Fourth Embodiment]

The color STN type simple matrix liquid crystal display module representing the fourth embodiment of the present invention is different from the simple matrix liquid crystal display module of the first embodiment in the structure of the IC chip mounted on the tape carrier package. In the tape carrier packages in the embodiments described above, originally the number of input terminals (the number of input side wires 302 connected with the terminals of the driving circuit board 204) may be less than the number of output terminals (the number of output side wires 303 connected with the terminals 23 of the liquid crystal display panel 100).

Figure 9:
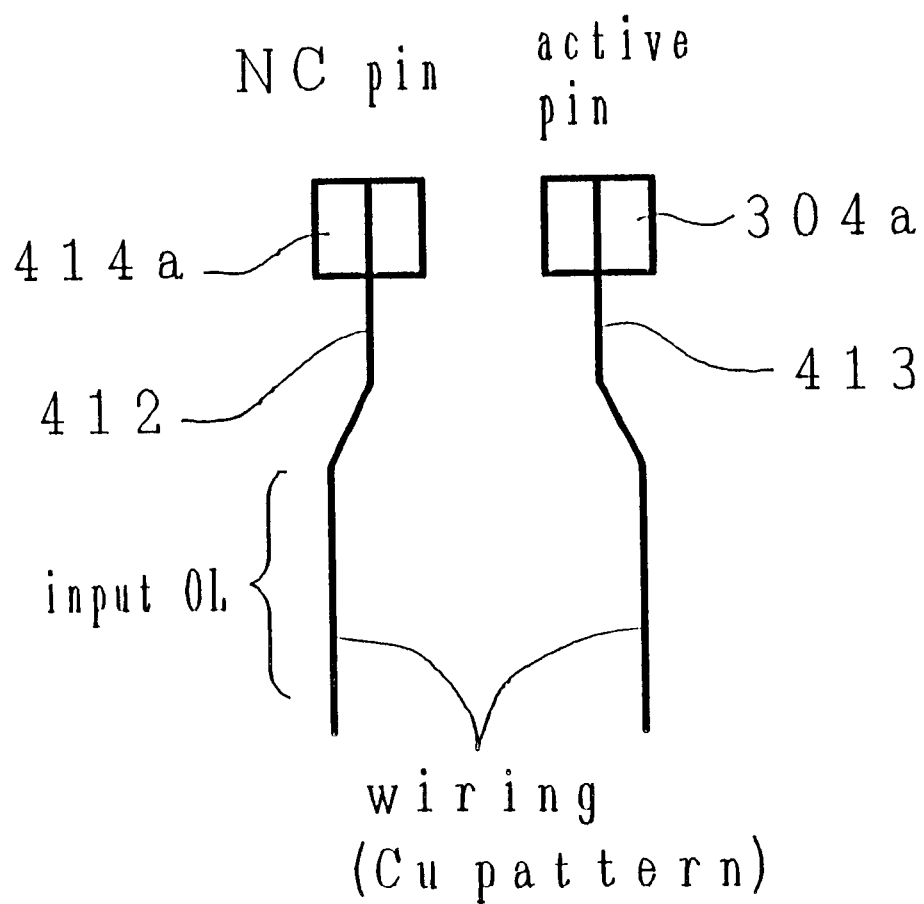
FIG. 9 is a diagram for explaining an NC pin and a dummy input side bonding pad of a prior art tape carrier package.
Figure 10:
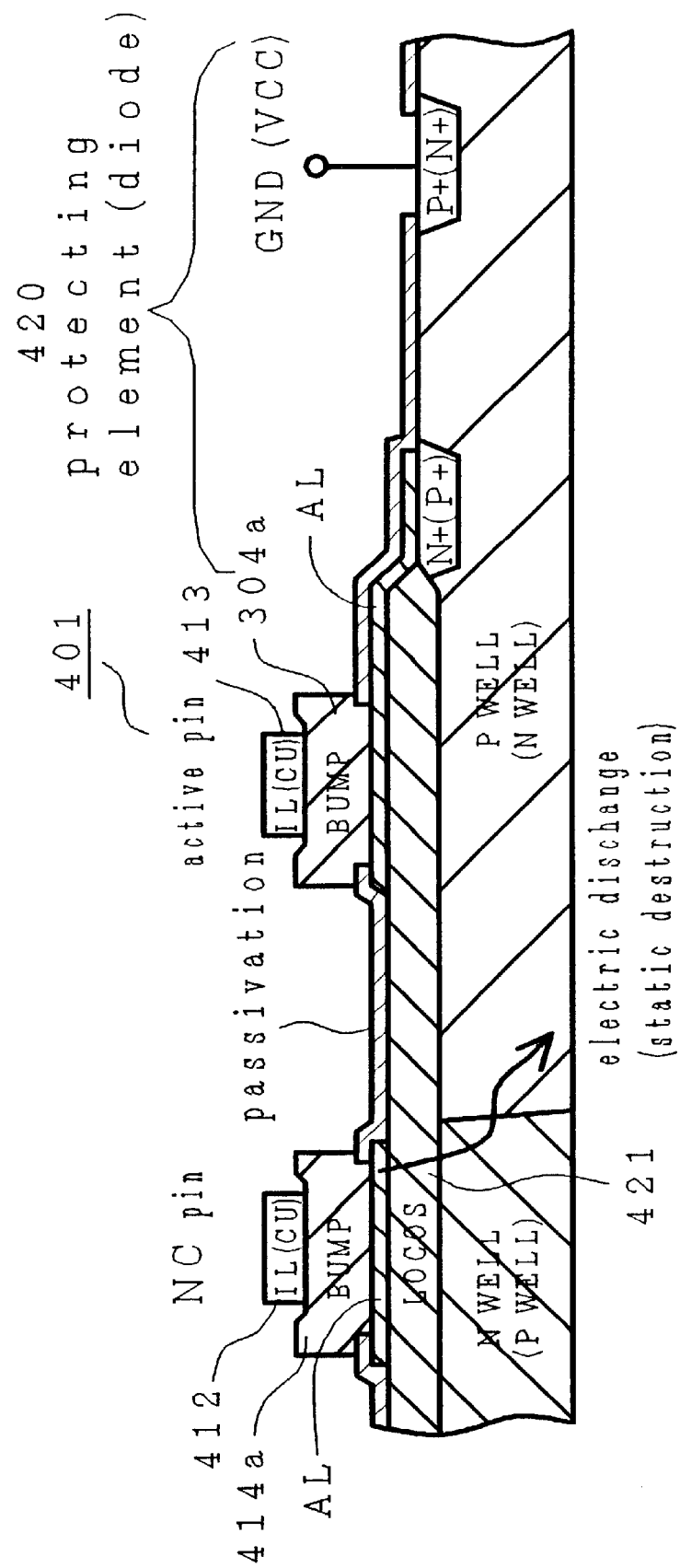
FIG. 10 is a section view of a main part of an input side bonding pad area in an IC chip mounted on the prior art tape carrier package.

FIG. 9 is a diagram for explaining an NC pin and a dummy input side bonding pad of a prior art tape carrier package, and FIG. 10 is a section view of a main part of an input side bonding pad area in an IC chip mounted on the prior art tape carrier package. As shown in FIG. 9, an NC pin (dead pin or dummy pin) 412 is provided in the input side wiring section of the tape carrier package and a dummy input side bonding pad 414a is provided in the IC chip 401 in order to keep the uniformity of the inner leads of the output side wires and the input side wires during bonding.

It is noted that in FIGS. 9 and 10, the reference numeral 413 denotes an input side wire (hereinafter referred to as an active pin) connected to the terminal 204 of the driving circuit board among the input side wires. At this time, while a protecting diode 420 is provided on an input side bonding pad 404a to which the active pin 413 is connected in the prior art IC chip 401, no protecting diode is provided on a dummy input side bonding pad 414a to which the NC pin 412 is connected and the dummy input side bonding pad 414a is provided on a LOCOS area 421, as shown in FIG. 10. Thus, when static electricity is applied to the NC pin 412 or the dummy input side bonding pad 414a, and the LOCOS area 421 is subject to static destruction by the static electricity, as shown in FIG. 10, the static electricity may flow within the IC chip 401 via the LOCOS area 421, thus destroying the IC chip 401.

Figure 11:
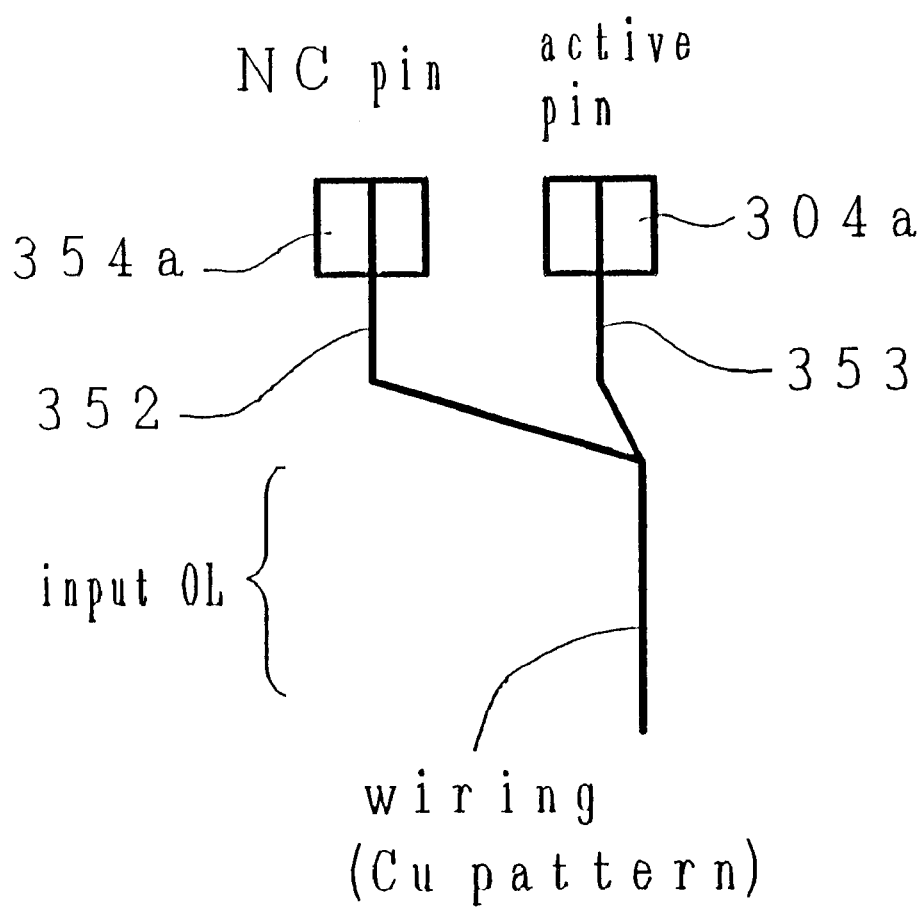
FIG. 11 is a diagram for explaining an NC pin and a dummy input side bonding pad of a tape carrier package according to a fourth embodiment of the present invention.

It is noted that FIG. 10 shows the two cases of forming the protecting diode 420 within a P-well and within an N-well. FIG. 11 is a diagram for explaining an NC pin and a dummy input side bonding pad of the tape carrier package according to the fourth embodiment of the present invention. The NC pin 352 is provided in the input side wire 302 of the tape carrier package and the dummy input side bonding pad 354a is provided in the IC chip 351 in order to keep the uniformity of the inner leads of the output side wire 303 and the input side wire 302 during bonding also in the tape carrier package of the fourth embodiment. However, as shown in FIG. 11, the NC pin 352 is connected with an active pin 353 (an input side wire connected with the terminal of the driving circuit board among the input side wires 302) in the tape carrier package of the fourth embodiment. In this case, the input side bonding pad 304a to which the active pin 353 is connected is provided with a protecting diode, so that even when static electricity is applied to the NC pin 352 or the dummy input side boding pad 354a, the static electricity is discharged to reference potential (power supply potential VCC or ground potential GND) via the protecting diode provided on the input side bonding pad 304a to which the active pin 353 is connected, and so the IC chip 351 will not be subject to static destruction. It is noted that, while the NC pin 352 is connected with the active pin 353 at the input side wiring section 302 of the tape carrier package in FIG. 11, the NC pin 352 may be connected with the active pin 353 within the IC chip 351.

Figure 12:
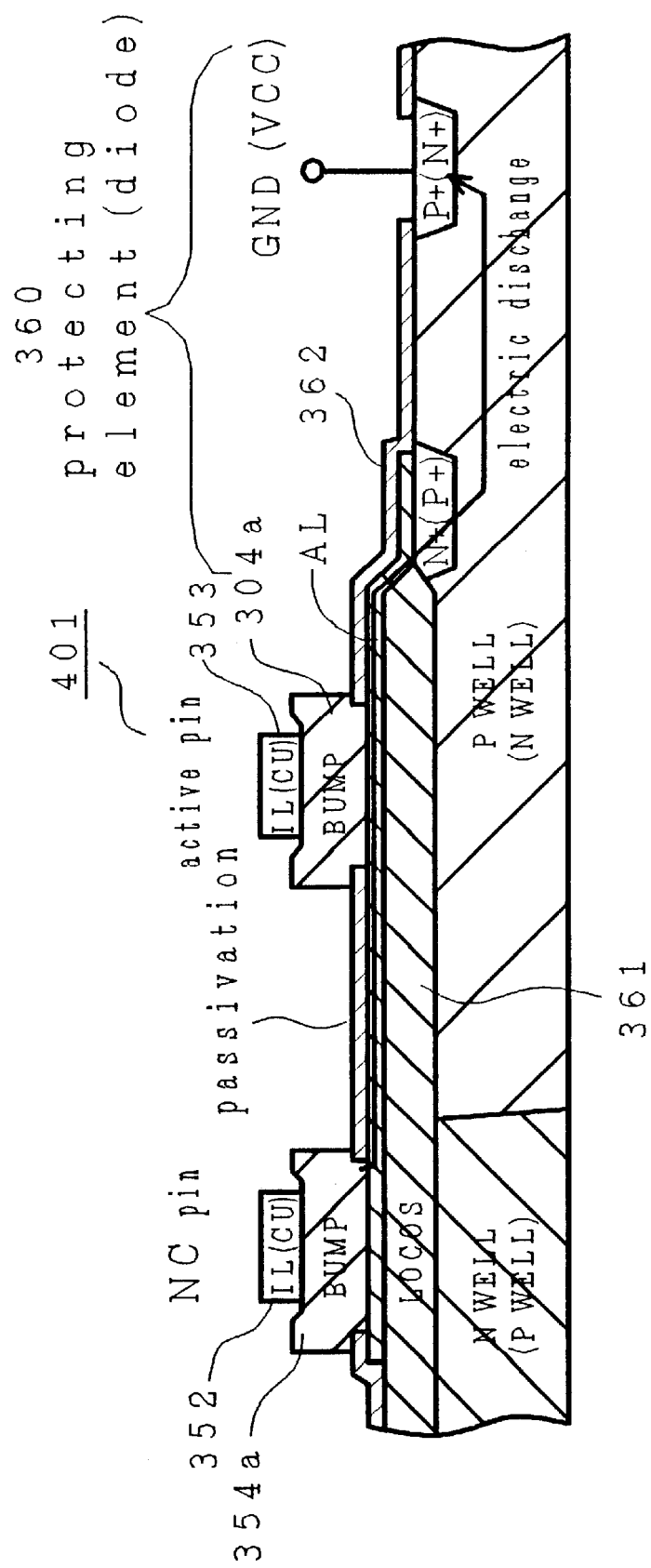
FIG. 12 is a section view of a main part of an input side bonding pad area in an IC chip mounted on the tape carrier package of the fourth embodiment of the present invention.

FIG. 12 is a section view of a main part of the input side bonding pad area in the IC chip 351 mounted on the tape carrier package of the fourth embodiment, wherein one example of the IC chip 351 arranged so as to connect the NC pin 352 to the active pin 353 within the IC chip is shown. As shown in FIG. 12, the input side bonding pad 304a of the IC chip 351 to which the active pin 353 is connected is provided with a protecting diode 360. Further, the dummy input side bonding pad 354a to which the NC pin 352 is connected is provided on the LOCOS area 361 and is connected with the input side bonding pad 304a to which the active pin 353 of the IC chip 351 is connected by an aluminum (Al) wiring layer 362.

Even when static electricity is applied to the NC pin 352 or the dummy input side boding pad 354a, the static electricity is discharged to reference potential (power supply potential VCC or ground potential GND) via the protecting diode 360 provided on the input side bonding pad 304a to which the active pin 353 is connected also in the IC chip 351 shown in FIG. 12. It is noted that FIG. 12 also shows the two cases of forming the protecting diode 360 within a P-well and within an N-well. As the structure of the output side bonding pad 304b of the IC chip 351 mounted on the tape carrier package of the fourth embodiment, the structure of the output side bonding pad of the IC chip of the previous embodiments may be adopted.

[Fifth Embodiment]

Figure 13:
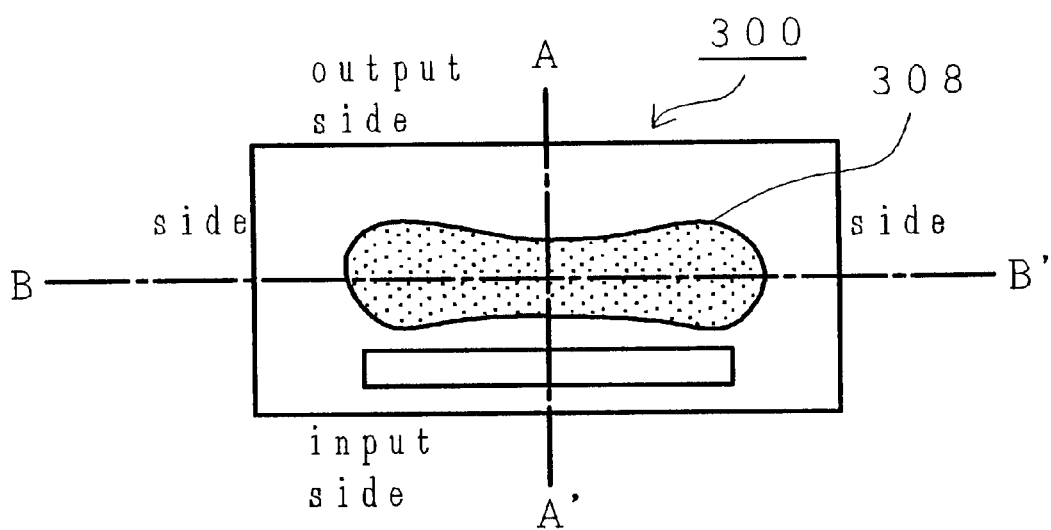
FIG. 13 is a diagram showing a face on the side where a wire of the tape carrier package of the first embodiment of the present invention is formed.

The color STN type simple matrix liquid crystal display module representing the fifth embodiment of the present invention is different from the simple matrix liquid crystal display module of the first embodiment in the structure of the tape carrier package. FIG. 13 is a diagram showing a face on the side where the wire of the tape carrier package of the first embodiment of the present invention is formed.

As shown in FIG. 13 or FIG. 5, the thermosetting resin 308 for protecting the IC chip is provided around the IC chip 301 in the tape carrier package of the first embodiment. The thermosetting resin 308 is formed by applying it on the face on the side where the bonding pads 304a and 304b of the IC chip 301 are provided and by heating and hardening it after bonding the inner leads of the input side wire 302 and the inner leads of the output side wire 303 to the input side bonding pads 304a and the output side bonding pads 304b of the IC chip 301.

In forming the thermosetting resin 308 shown in FIG. 13 or 5, there has been a case when the thermosetting resin 308 leaked between the base film 305 and the IC chip 301 and leaks out and hardens in an area facing the outer leads of the output side wire 303 on the face on the opposite side from the face of the base film 305 where the wires are formed. In connecting the outer leads of the output side wires 303 with the connection terminals 23 of the liquid crystal display panel 100 by means of the anisotropic conductive film, a jig is applied to the area facing the outer lead of the output side wire 303 on the face on the opposite side from the face of the base film 305 where the wires are formed to pressurize and heat it. Accordingly, if the thermosetting resin 308 is formed on the area facing the outer lead of the output side wire 303 on the face on the opposite side from the face of the base film 305 where the wires are formed, the jig cannot be applied correctly on the base film 305 in connecting the outer lead of the output side wire 303 with the connection terminal 23 of the liquid crystal display panel 100, causing not only a defective connection of the outer lead of the output side wire 303 with the connection terminal 23 of the liquid crystal display panel 100, but also the destruction of the IC chip 301.

Thus, according to the fifth embodiment of the present invention, the tape carrier package 370 is provided with suppressing means for suppressing an amount of the thermosetting resin leaking between the base film 305 and the IC chip 371 so that the thermosetting resin 308 will not leak to the area facing the outer lead of the output side wire 303 on the face on the opposite side from the face of the base film 305 where the wires are formed.

FIGS. 14(a) through 17(b) are schematic section views showing examples of the suppressing means in the tape carrier package 370 according to the fifth embodiment of the present invention, wherein FIGS. 14(a), 15(a), 16(a) and 17(a) are section views taken along a line A–A' in FIG. 13 and FIGS. 14(b), 15(b), 16(b) and 17(b) are section views taken along a line B–B' in FIG. 13.

Figure 14A:
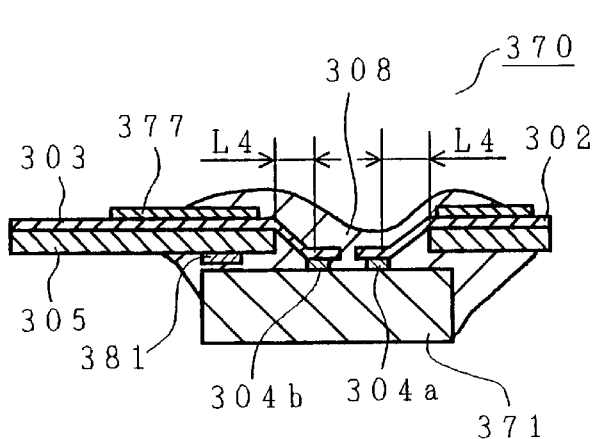
FIGS. 14a and 14b are schematic section views taken along lines A–A' and B–B', respectively, of FIG. 13 showing one example of suppressing means in a tape carrier package according to a fifth embodiment of the present invention.
Figure 14B:
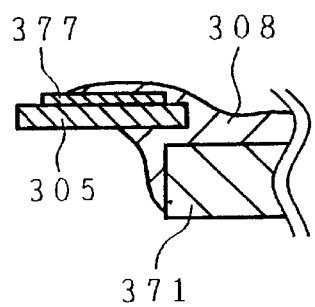

In the tape carrier package 370 shown in FIGS. 14(a) and 14(b), an insulating tape 381 is pasted on the face on the opposite side from the face of the base film 305 where the wires are formed and in an area corresponding to the peripheral portion of the IC chip 371 on the side of the liquid crystal display panel 100 to reduce the amount of thermosetting resin leaking between the base film 305 and the IC chip 371, so that the thermosetting resin 308 will not leak to the area facing to the outer leads of the output side wire 303 on the face on the opposite side from the face of the base film 305 where the wires are formed.

In this way, it is possible to prevent a defective connection from being made between the outer lead of the output side wire 303 and the connection terminal 23 of the liquid crystal display panel 100 in the tape carrier package 370 shown in FIGS. 14(a) and 14(b). It is also possible to paste the insulating film 381 on the face on the opposite side from the face of the base film 305 where the wires are formed and in the area corresponding to the peripheral portion of the IC chip 371 on the side of the driving circuit board 204, so that the thermosetting resin 308 will not leak to the area facing the outer lead of the input side wire 302 on the face on the opposite side from the face of the base film 305 where the wires are formed. In this case, it also becomes possible to prevent a defective connection of the outer lead of the input side wire 302 with the driving circuit board 204.

Figure 15A:
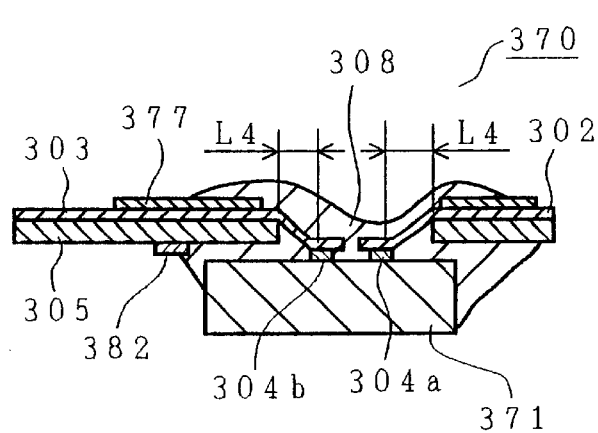
FIGS. 15a and 15b are schematic section views taken along lines A–A' and B–B', respectively, of FIG. 13 showing a further example of suppressing means in the tape carrier package according to the fifth embodiment of the present invention.
Figure 15B:
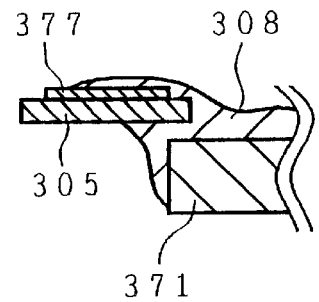

In the tape carrier package 370 shown in FIGS. 15(a) and 15(b), a solder resist film 382 is formed on the face on the opposite side from the face of the base film 305 where the wires are formed and in an area which does not overlap with the IC chip 371 on the side of the liquid crystal display panel 100 of the IC chip 371 to reduce the amount of thermosetting resin leaking between the base film 305 and the IC chip 371 so that the thermosetting resin 308 will not leak to the area facing the outer leads of the output side wire 303 on the face on the opposite side from the face of the base film 305 where the wires are formed.

In this way, it is possible to prevent a defective connection from being made between the outer lead of the output side wire 303 and the connection terminal 23 of the liquid crystal display panel 100 also in the tape carrier package 370 shown in FIGS. 15(a) and 15(b). It is also possible to form the solder resist film 382 on the face on the opposite side from the face of the base film 305 where the wires are formed and in the area which does not overlap with the IC chip 371 on the side of the driving circuit board 204 of the IC chip 371, so that the thermosetting resin 308 will not leak to the area facing the outer leads of the input side wire 302 on the face on the opposite side from the face of the base film 305 where the wires are formed. In this case, it also becomes possible to prevent a defective connection of the outer lead of the input side wire 302 with the driving circuit board 204.

Figure 16A:
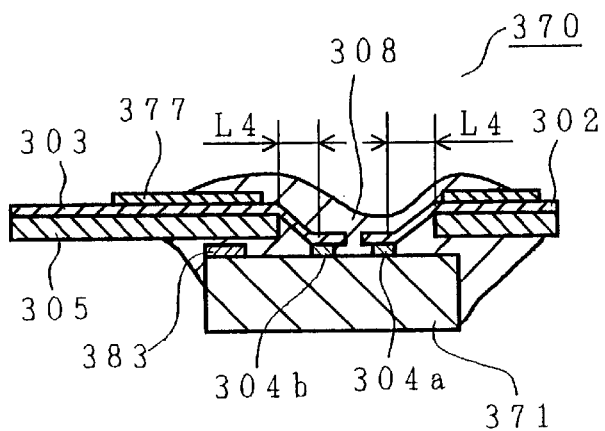
FIGS. 16a and 16b are schematic section views taken along lines A–A' and B–B', respectively, of FIG. 13 showing a further example of suppressing means in the tape carrier package according to the fifth embodiment of the present invention.
Figure 16B:
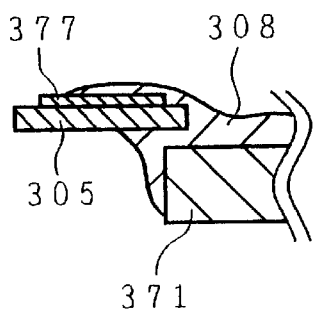

In the tape carrier package 370 shown in FIGS. 16(a) and 16(b), a LOCOS area or an aluminum (Al) wire 383 is formed on the face on the side overlapping with the base film 305 of the IC chip 371 and in the area of the peripheral portion of the IC chip 371 on the side of the liquid crystal display panel 100 to reduce the amount of thermosetting resin leaking between the base film 305 and the IC chip 371 so that the thermosetting resin 308 will not leak to the area facing the outer leads of the output side wire 303 on the face on the opposite side from the face of the base film 305 where the wires are formed.

In this way, it is possible to prevent a defective connection from being made between the outer lead of the output side wire 303 and the connection terminal 23 of the liquid crystal display panel 100 also in the tape carrier package 370 shown in FIGS. 16(a) and 16(b). It is also possible to form the LOCOS area or the aluminum (Al) wire 383 on the face on the side overlapping with the base film 305 of the IC chip 371 and in the area of the peripheral portion of the IC chip 371 on the side of the driving circuit board 204, so that the thermosetting resin 308 will not leak to the area facing the outer leads of the input side wire 302 on the face on the opposite side from the face of the base film 305 where the wires are formed. In this case, it also becomes possible to prevent a defective connection of the outer lead of the input side wire 302 with the driving circuit board 204.

Figure 17A:
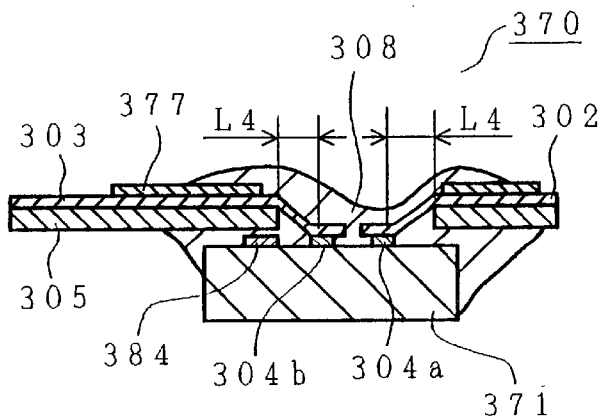
FIGS. 17a and 17b are schematic section views taken along lines A–A' and B–B', respectively, of FIG. 13 showing still another example of suppressing means in the tape carrier package according to the fifth embodiment of the present invention.
Figure 17B:
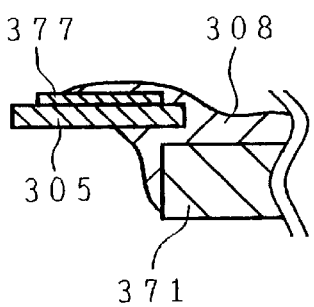

In the tape carrier package 370 shown in FIGS. 17(a) and 17(b), a gold (Au) bump area 384 for example is formed on the face on the side overlapping with the base film 305 of the IC chip 371 and in the peripheral portion of the IC chip 371 on the side of the liquid crystal display panel 100 to reduce the amount of thermosetting resin leaking between the base film 305 and the IC chip 371, so that the thermosetting resin 308 will not leak to the area facing the outer leads of the output side wire 303 on the face on the opposite side from the face of the base film 305 where the wires are formed.

In this way, it is possible to prevent a defective connection from being made between the outer lead of the output side wire 303 and the connection terminal 23 of the liquid crystal display panel 100 also in the tape carrier package 370 shown in FIGS. 17(a) and 17(b). It is also possible to form the gold (Au) bump area 384, for example, on the face on the side overlapping with the base film 305 of the IC chip 371 and in the area of the peripheral portion of the IC chip 371 on the side of the driving circuit board 204, so that the thermosetting resin 308 will not leak to the area facing the outer leads of the input side wire 302 on the face on the opposite side from the face of the base film 305 where the wires are formed. In this case, it becomes possible to prevent a defective connection of the outer lead of the input side wire 302 with the driving circuit board 204.

It is noted that in the tape carrier package 370 shown in FIGS. 14(a) through 17(a), the length of the inner leads of the input side wire 302 and the output side wire 303 must be at least 260 μm or more because the inner leads of the input side wire 302 and the output side wire 303 are disconnected in connecting the inner leads of the input side wire 302 and the output side wire 303 with the input side bonding pad 304a and the output side bonding pad 304b of the IC chip 371 by the gang bonding when the length L4 of the inner leads of the input side wire 302 and the output side wire 303 is reduced. The reference numeral 377 denotes a solder resist film for masking so that no solder is pasted on unnecessary parts. It is needless to say that the suppressing means for suppressing the amount of the thermosetting resin leaking from the base film 305 and the IC chip 371 of the fifth embodiment may be applied to the tape carrier package of each embodiment described above. Further, although the present invention has been explained by way of example with reference to cases in which the present invention is applied to an STN type simple matrix liquid crystal display panel, it is also needless to say that the present invention is not confined only to such an application and may be applied also to a TFT type active liquid crystal display panel.

While the invention made by the present inventor has been explained concretely based on various embodiments thereof, the invention is not confined only to the embodiments described above and may be variously modified within the scope of the invention which is delineated by the following claims.

What is claimed is:

1. A liquid crystal display device comprising:

a liquid crystal display panel;

a plurality of tape carrier packages provided around said liquid crystal display panel and having liquid crystal driving circuits for outputting driving voltages to electrodes of said liquid crystal display panel; and circuit boards for supplying signals to said liquid crystal driving circuits;

each tape carrier package comprising:

a semiconductor chip having a plurality of input terminals and a plurality of output terminals; and a film having an opening at the middle thereof and provided with a plurality of output side wires to be connected to a plurality of electrodes of said liquid crystal display panel and a plurality of input side wires to be connected to said circuit board;

said semiconductor chip being disposed on said film so that peripheral portions of said semiconductor chip at least on the side of said liquid crystal display panel and said circuit board overlap with the peripheral portion of said opening of said film and said input terminals, and said output terminals of said semiconductor chip being disposed in proximity such that at least a part of a slanted wiring section of said output side wires is provided in the area where the peripheral portion of said semiconductor chip overlaps with the peripheral portion of said opening of said film.

2. The liquid crystal display device according to claim 1, wherein said semiconductor chip comprises a latch circuit for primarily latching input imaging data, a selector circuit for converting the input imaging data latched by said latch circuit into a liquid crystal driving voltage, and an output buffer circuit for converting the an output from said selector circuit corresponding to liquid crystal alternating signals to an output to said output terminal, said latch circuit, said selector circuit and said buffer circuit being disposed within said semiconductor chip so that the signal input from said input terminal flows partially toward said circuit board from said liquid crystal display panel.

3. The liquid crystal display device according to claim 1, wherein said semiconductor chip comprises a latch circuit for primarily latching input imaging data, a selector circuit for converting the input imaging data latched by said latch circuit into a liquid crystal driving voltage, and an output buffer circuit for converting the an output from said selector circuit corresponding to liquid crystal alternating signals to an output to said output terminal, said selector circuit being disposed on the side of said liquid crystal display panel rather than said output buffer circuit disposed near said output terminal within said semiconductor chip.

4. The liquid crystal display device according to claim 1, wherein said semiconductor chip comprises a latch circuit for primarily latching input imaging data, a selector circuit for converting the input imaging data latched by said latch circuit into a liquid crystal driving voltage, and an output buffer circuit for converting the an output from said selector circuit corresponding to liquid crystal alternating signals to an output to said output terminal, said latch circuit, said selector circuit and said buffer circuit being not disposed between said input terminal and said output terminal.

5. The liquid crystal display device according to claim 1, wherein a length of said output side wire formed on said film overlapping with said semiconductor chip is set to be longer than a length of said input side wire formed on said film overlapping with said semiconductor chip.

6. The liquid crystal display device according to claim 1, wherein said plurality of output terminals of said semiconductor chip are provided on the side of said circuit board of said semiconductor chip from a middle position between the lead of said semiconductor chip on the side of said liquid crystal display panel and the lead of said semiconductor chip on the side of said circuit board.

7. The liquid crystal display device according to claim 1, wherein said plurality of input terminals and said plurality of output terminals of said semiconductor chip are provided almost on a straight line in the middle or in the area on the side of said circuit board of said semiconductor chip.

8. The liquid crystal display device according to claim 1, wherein said semiconductor chip has a plurality of dummy input terminals which do not contribute to the driving of the liquid crystal and which are connected to a plurality of dummy input side wires provided on said film which do not contribute to the driving of the liquid crystal, said dummy input terminals being connected with adjoining input terminals for driving the liquid crystal within said semiconductor chip or on said film.

9. The liquid crystal display device according to claim 1, wherein a protecting member is provided for protecting connecting sections of said input terminals and output terminals of said semiconductor chip with said input side wires and output side wires disposed on said film and suppressing means for suppressing said protecting member from leaking between said semiconductor chip and said film is provided near said semiconductor chip on a face on the opposite side from a face of said film on which said input side wires and said output side wires are disposed.

10. The liquid crystal display device according to claim 1, wherein said semiconductor chip is disposed on said film so that all the peripheral portions thereof overlap with the peripheral portion of the opening of said film.

* * * * *